United States Patent
Yang et al.

(10) Patent No.: US 9,893,711 B2
(45) Date of Patent: Feb. 13, 2018

(54) PIEZOELECTRIC DEVICE

(71) Applicant: Daishinku Corporation, Hyogo (JP)

(72) Inventors: Liyan Yang, Hyogo (JP); Kentaro Nakanishi, Hyogo (JP)

(73) Assignee: Daishinku Corporation, Hyogo (JP)

( * ) Notice: Subject to any disclaimer, the term of this patent is extended or adjusted under 35 U.S.C. 154(b) by 555 days.

(21) Appl. No.: 14/399,757

(22) PCT Filed: Mar. 14, 2013

(86) PCT No.: PCT/JP2013/001744
§ 371 (c)(1),
(2) Date: Nov. 7, 2014

(87) PCT Pub. No.: WO2013/168339
PCT Pub. Date: Nov. 14, 2013

(65) Prior Publication Data
US 2015/0108875 A1    Apr. 23, 2015

(30) Foreign Application Priority Data
May 10, 2012   (JP) .................................. 2012-108387

(51) Int. Cl.
*H03H 9/05* (2006.01)
*H03H 9/17* (2006.01)
(Continued)

(52) U.S. Cl.
CPC .............. *H03H 9/17* (2013.01); *B06B 1/0648* (2013.01); *H01L 41/053* (2013.01);
(Continued)

(58) Field of Classification Search
CPC ...... H01L 41/053; H03H 9/05; H03H 9/0509; H03H 9/0514; H03H 9/0919; H03H 9/02157; H03H 9/17
(Continued)

(56) References Cited

U.S. PATENT DOCUMENTS 6,229,249 B1 *   5/2001   Hatanaka ................. H03B 5/04
                                                     310/348
6,515,405 B1 *   2/2003   Kumasaka ............ H01L 41/053
                                                     310/345
(Continued)

FOREIGN PATENT DOCUMENTS

JP          7-25620         1/1995
JP       2000-340690      12/2000
(Continued)

OTHER PUBLICATIONS

Machine translation of JP2002-158558.*

*Primary Examiner* — Derek Rosenau
(74) *Attorney, Agent, or Firm* — Norris McLaughlin & Marcus, P.A.

(57) ABSTRACT

A piezoelectric device is provided with a rectangular crystal piece having driving electrodes on front and back main faces thereof, and a base member having two electrode pads near one short side of the crystal piece. The crystal piece is supported on the base member by two support portions near one short side thereof, and by an auxiliary support portion on the other short side thereof. A position of the auxiliary support portion relative to the other short side, where L is a distance between two short sides, and H is a distance from the other short side to a peripheral edge of the auxiliary support portion nearest to the other short side, is set to a position at which the distance H stays in a range of distances in which a maximum tensile stress acting on the auxiliary support portion and a maximum von Mises stress of the crystal piece are within predetermined ranges.

17 Claims, 18 Drawing Sheets

(51) Int. Cl.
  *B06B 1/06* (2006.01)
  *H01L 41/053* (2006.01)
  *H03H 9/02* (2006.01)
  *H03H 9/13* (2006.01)
  *H03H 9/10* (2006.01)

(52) U.S. Cl.
  CPC .... *H03H 9/02133* (2013.01); *H03H 9/02157* (2013.01); *H03H 9/0509* (2013.01); *H03H 9/0514* (2013.01); *H03H 9/0519* (2013.01); *H03H 9/0523* (2013.01); *H03H 9/1021* (2013.01); *H03H 9/132* (2013.01); *H03H 9/1014* (2013.01)

(58) Field of Classification Search
  USPC .......................................... 310/340, 344, 348
  See application file for complete search history.

(56) References Cited

U.S. PATENT DOCUMENTS

| | | | | |
|---|---|---|---|---|
| 7,116,039 | B2* | 10/2006 | Arai | H03H 9/02007 310/341 |
| 7,271,525 | B2* | 9/2007 | Byers | H03H 9/1021 310/330 |
| 2009/0140613 | A1 | 6/2009 | Akane et al. | |
| 2011/0221309 | A1 | 9/2011 | Umeki | |

FOREIGN PATENT DOCUMENTS

| | | |
|---|---|---|
| JP | 2000-341041 | 12/2000 |
| JP | 2002-158558 | 5/2002 |
| JP | 2003-060475 A | 2/2003 |
| JP | 2004-48384 | 2/2004 |
| JP | 2006-295700 | 10/2006 |
| JP | 2008-206002 | 9/2008 |
| JP | 2010-130123 | 6/2010 |
| JP | 2010-136174 | 6/2010 |

* cited by examiner

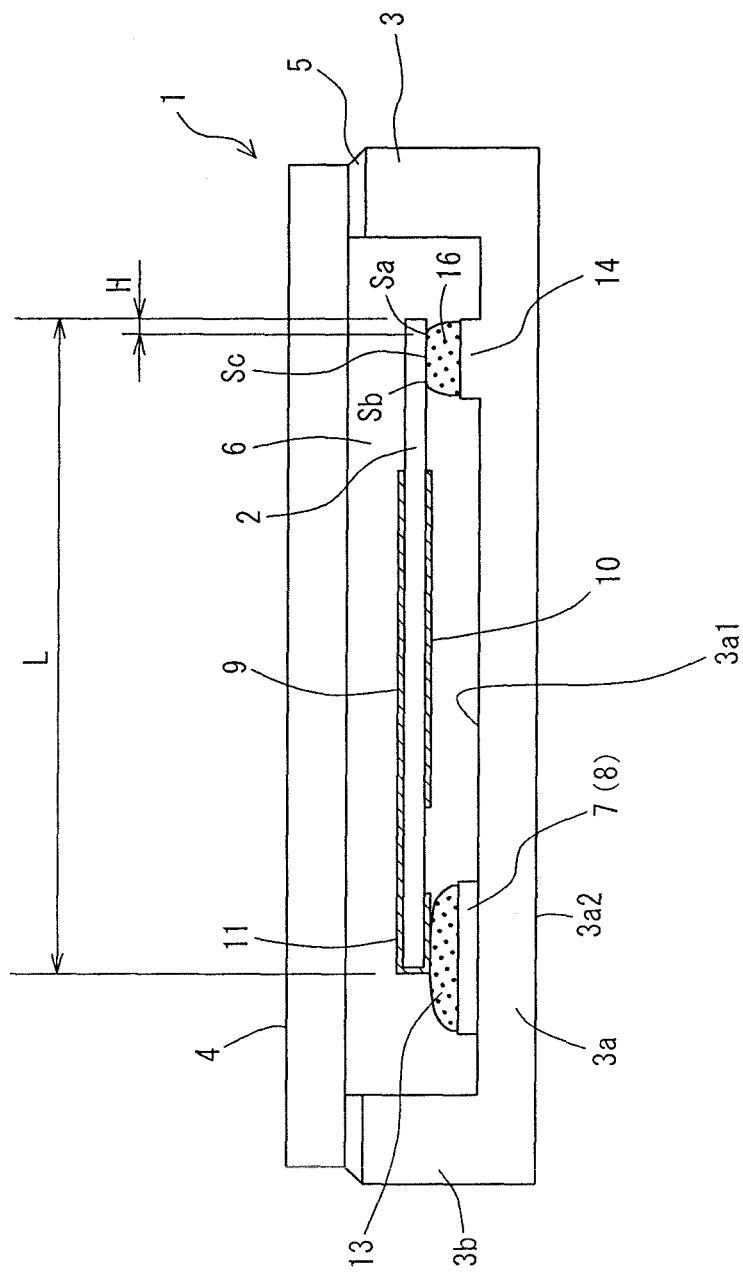
F I G. 1 stress distribution (first size)

(a) positions of support portions | (b) von Mises stress distribution on front surface of crystal (1) 0.001mm (2) 0.05mm (3) 0.1mm (4) 0.15mm (5) 0.2mm (6) 0.25mm distance h1 from long side of crystal piece [mm]
(near peripheral edge distance)

distance h1 from long side of crystal piece [mm]
(near peripheral edge distance)

F I G. 24A
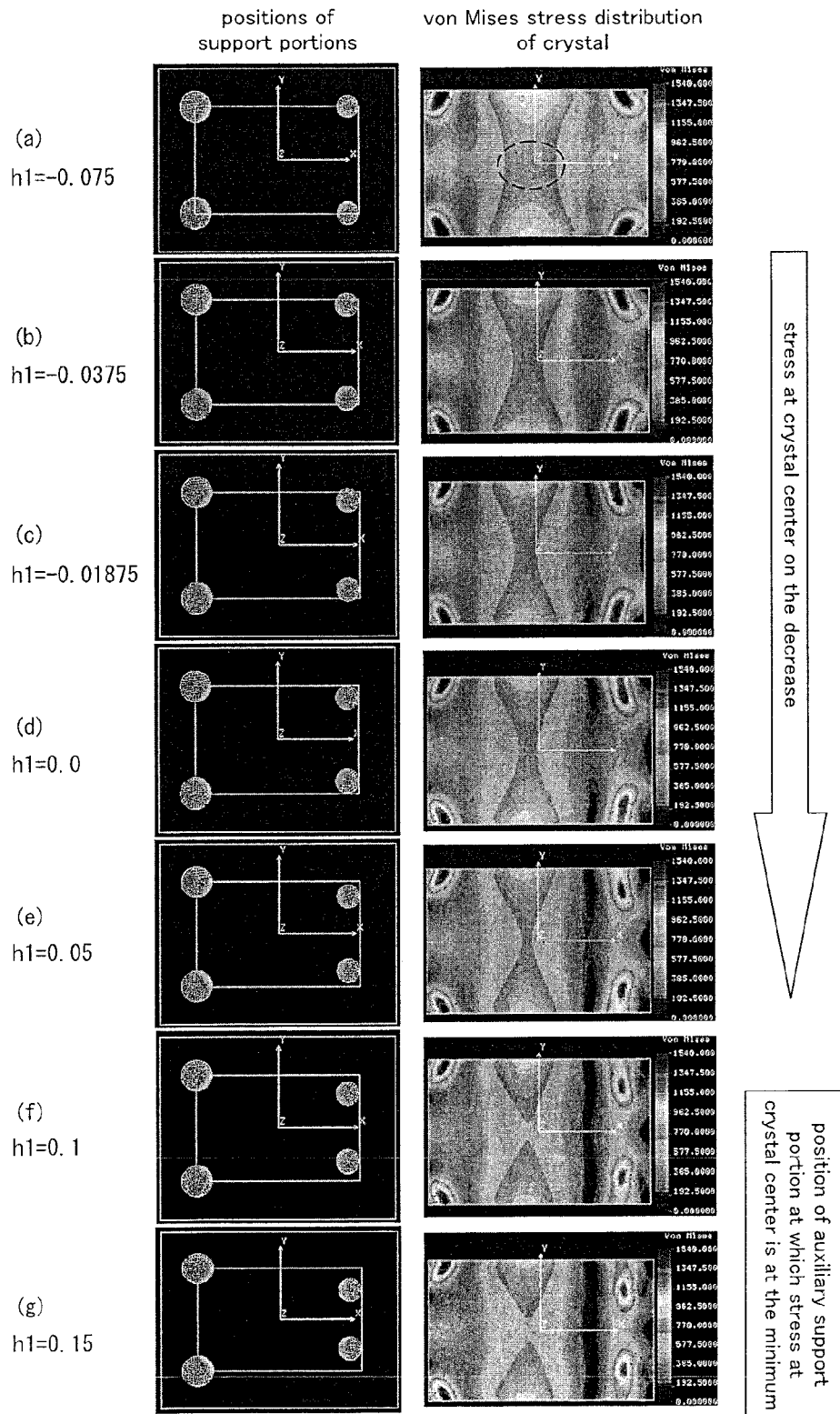

(g) h1=0.15

(h) h1=0.2

(i) h1=0.25

(j) h1=0.30

(k) h1=0.35

PIEZOELECTRIC DEVICE

BACKGROUND OF THE INVENTION

The invention relates to piezoelectric devices including piezoelectric oscillators and piezoelectric resonators such as crystal resonators.

Today, piezoelectric oscillators and piezoelectric resonators such as crystal resonators are employed in a broad range of applications to ensure precise frequencies and keep track of time in the field of, for example, communication devices such as cellular phones and car phones, and electronic devices including information devices such as computers and IC cards.

One of the applications in recent years is to use crystal resonators as sensor modules of tire pressure monitoring systems (TPMS). Such a sensor module is equipped with an oscillation unit having a crystal resonator and a tire sensor for detection of air pressure. The sensor module is attached to an automobile tire to wirelessly output and transmit a sensing result of the tire sensor to, for example, a driving seat.

The sensor module is attached to, for example, the inner peripheral surface or wheel of the tire and rotated with the tire at very high speeds while the automobile is travelling. The oscillation unit with the crystal resonator is, therefore, subject to centrifugal acceleration during the rotation and also subject to impacts from the road surface. The technical standards set forth for centrifugal acceleration as high as 2000 G demand superior resistance to impact for any crystal resonators for use at such high speeds.

JP-Utility Model Application Publication No. H07-25620 A, for example, discloses a structure directed at improving the resistance to impact, wherein a protrusion is formed in a bottom portion of a crystal piece housing package so that a crystal piece is fixated to and supported by the protrusion.

SUMMARY OF THE INVENTION

However, the piezoelectric resonators so far disclosed have disadvantages. For example, when the piezoelectric resonators are acted upon by high centrifugal acceleration, their resistances to impact may degrade, breaking joined parts of piezoelectric vibration pieces provided therein and package electrodes. The occurrence of such an event disables functions expected in the piezoelectric resonators including oscillation.

The invention was accomplished to solve the conventional problem and has an object to provide a piezoelectric device superior in resistance to impact.

To achieve the object, the inventors of this invention, who earnestly worked on solving the problem, came up with the idea of additionally providing an auxiliary support portion(s) to support a piezoelectric vibration piece on a base member in addition to first and second support portions provided for the same purpose. More specifically, two electrode pads on a base member and a pair of electrodes on one of two opposing sides of a piezoelectric vibration piece having an outer shape rectangular in plan view are electrically joined, and at least a position of the other one of the two opposing sides of the piezoelectric vibration piece, which is different to the positions of the first and second support portions, is joined to the base member. Through the various studies and experiments, the inventors learned that locating the auxiliary support portion in a particular region could lessen stresses that may act upon the support portions and the piezoelectric vibration piece subject to high centrifugal acceleration, thereby enhancing the resistance to impact. Then, the invention was finally completed.

A piezoelectric device according to the invention includes:

a piezoelectric vibration piece having an outer shape rectangular in plan view and provided with driving electrodes on front and back main surfaces thereof, the piezoelectric vibration piece further including a pair of electrodes for respectively extracting the driving electrodes toward one of a first pair of opposing sides of two pairs of opposing sides forming the rectangular shape;

a base member having two electrode pads on an upper surface thereof, the electrode pads being respectively connected to the pair of electrodes; and first and second support portions formed of a conductive joining material to electrically join the pair of electrodes respectively to the two electrode pads, the first and second support portions being provided to support the one of the first pair of opposing sides on the back surface of the piezoelectric vibration piece, wherein an auxiliary support portion is further provided, the auxiliary support portion being formed of a joining material for joining, in a predetermined joint region, at least a position of the piezoelectric vibration piece near the other one of the first pair of opposing sides on the back surface thereof to the upper surface of the base member, the auxiliary support portion supporting the piezoelectric vibration piece at the position near the other one of the first pair of opposing sides on the back surface thereof and a position of the auxiliary support portion relative to the other one of the first pair of opposing sides is set to a position at which a value of (H2+D)/L expressed in percentage is equal to or smaller than 20%, where L is a distance between the first pair of opposing sides, H2 is a distance from the other one of the first pair of opposing sides to a peripheral edge of the auxiliary support portion nearest to the other one of the first pair of opposing sides when the auxiliary support portion is at a position farthest from the other one of the first pair of opposing sides, and D is a distance between the peripheral edge nearest to and a peripheral edge farthest from the other one of the first pair of opposing sides in a direction along the distance L.

This aspect of the invention includes a piezoelectric device provided with plural auxiliary support portions, wherein one of or both of the auxiliary support portions are located at positions farthest from the other one of the first pair of opposing side.

According to a preferable aspect of the invention, the value of (H2+D)/L expressed in percentage is equal to or smaller than 19%.

According to another preferable aspect of the invention, the value of (H2+D)/L expressed in percentage is between 2% to 20%.

According to yet another preferable aspect of the invention, of the two pairs of opposing sides forming the rectangular shape, the first pair of opposing sides is a pair of short sides and a second pair of opposing sides is a pair of long sides, and the auxiliary support portion is located on a centerline that connects center points of the short sides.

According to yet another preferable aspect of the invention, the auxiliary support portion is joined to the upper surface of the base member by means of the joining material as first and second auxiliary support portions formed at not less than two positions near the other one of the first pair of opposing sides.

According to yet another preferable aspect of the invention, the first and second auxiliary support portions are located at positions line-symmetric to the centerline connecting center points of each of the long sides and extending parallel with the short sides.

According to yet another preferable aspect of the invention, the piezoelectric vibration piece has a pair of auxiliary electrodes for respectively extracting the driving electrodes toward the other of the first pair of opposing sides of the two pairs of opposing sides, the base member has, on the upper surface thereof, two auxiliary electrode pads respectively connected to the pair of auxiliary electrodes, and the first and second auxiliary support portions electrically join the pair of auxiliary electrodes to the two auxiliary electrode pads.

According to yet another preferable aspect of the invention, the base member has a structure in which a recessed portion for housing therein the piezoelectric vibration piece is defined by a bottom portion and a circumferential portion formed so as to surround the bottom portion, the bottom portion has a step portion on an inner peripheral surface thereof, and the electrode pads, the support portions, and the auxiliary support portions are formed on the step portion.

According to yet another preferable aspect of the invention, the joining material is a pasty adhesive, and the conductive joining material of the support portions is a pasty conductive adhesive.

According to yet another preferable aspect of the invention, the adhesive of the auxiliary support portion and the conductive adhesive of the support portions respectively have outer shapes circular or elliptical in plan view.

According to yet another preferable aspect of the invention, the adhesive of the auxiliary support portion has a thickness in the range of 10 μm to 30 μm.

According to yet another preferable aspect of the invention, an integrated circuit for driving the piezoelectric vibration piece is joined to the base member and electrically connected to the piezoelectric vibration piece.

According to yet another preferable aspect of the invention, the piezoelectric vibration piece is a crystal piece.

EFFECT OF THE INVENTION

The invention succeeds in reductions of stresses that may act upon the support portions and the piezoelectric vibration piece subject to high centrifugal acceleration, thereby achieving a higher resistance to impact.

BRIEF DESCRIPTION OF THE DRAWINGS

FIG. 1 is a sectional view of a crystal resonator according to an embodiment of the invention.

FIG. 24A are illustrations of positions of support portions and a von Mises stress distribution of a crystal piece in the second-size evaluation model.

MODES FOR CARRYING OUT THE INVENTION

Hereinafter, embodiments of the invention are described in detail referring to the accompanying drawings.

In the description of the embodiments hereinafter given, a crystal resonator, which is an example of piezoelectric resonators, is used as a piezoelectric device.

Figure 2:
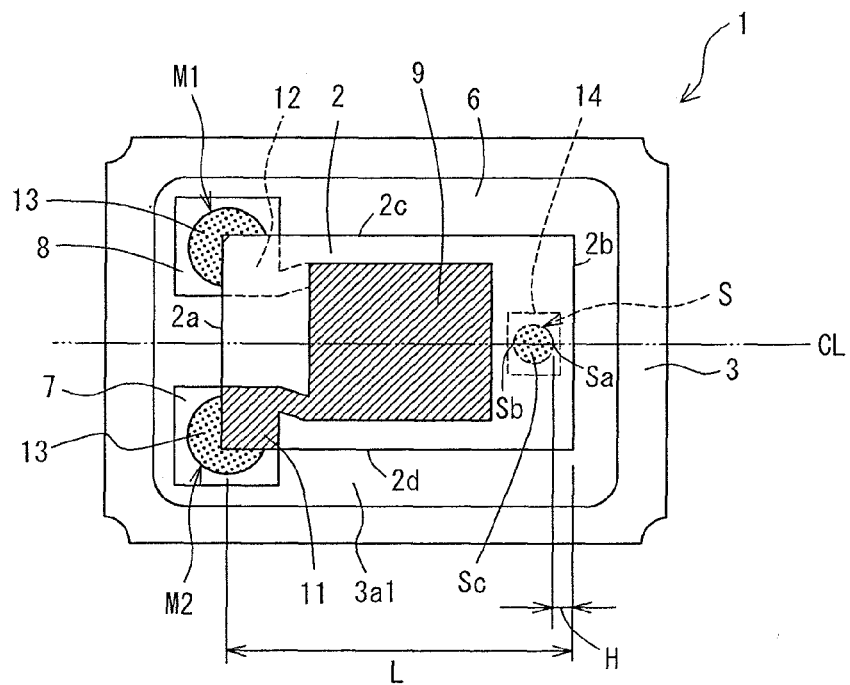
FIG. 2 is a plan view of the crystal resonator illustrated in FIG. 1 after a cover is removed.

FIG. 1 is a sectional view of a crystal resonator according to an embodiment of the invention. FIG. 2 is a plan view of the crystal resonator illustrated in FIG. 1 after a package cover is removed.

A crystal resonator 1 according to the embodiment includes a crystal piece 2 which is a piezoelectric vibration piece, a base member 3 having a recessed portion which houses therein the crystal piece 2, and a cover 4 which air-tightly seals an opening of the base member 3. The base member 3 and the cover 4 constitute a package. The base member 3 has a bottom portion 3a rectangular in plan view, and a circumferential portion 3b formed in a frame-like shape so as to surround the bottom portion 3a, wherein these portions constitute the recessed portion 6.

An upper surface of the frame-shaped circumferential portion of the ceramic base member 3 and an outer peripheral portion of the metallic cover 4 are joined to each other with a joining material 5 such as seal glass. The cover 4 and the base member 3 thus joined constitute a housing space, in which the crystal piece 2 is housed.

The base member 3 has an outer shape substantially rectangular in plan view. On an inner bottom surface 3a1 of the base member 3 are formed a pair of metallic electrodes pads 7 and 8 at two corner sections near a short side of the recessed portion 6. On an outer bottom surface 3a2 of the base member 3 are external terminals (not illustrated in the drawings) which are to be joined to external devices with, for example, a solder material. The electrode pads 7 and 8 and the external terminals are electrically connected by the use of an internal wiring conductor.

The crystal piece 2 is an AT-cut crystal piece having an outer shape rectangular in plan view. This rectangular crystal piece 2 has two pairs of opposing sides 2a and 2b, and 2c and 2d; a first pair of opposing sides 2a and 2b, and a second pair of opposing sides 2c and 2d. The opposing sides 2a and 2b are short sides in parallel with each other, and the opposing sides 2c and 2d are long sides in parallel with each other.

On front and back main surfaces of the crystal piece 2 are formed a pair of driving electrodes 9 and 10 for driving the crystal piece 2 at vertically corresponding positions. Extraction electrodes 11 and 12 are extending from the driving electrodes 9 and 10 toward both ends of the short side 2a. The paired extraction electrodes 11 and 12 of the crystal piece 2 and the electrode pads 7 and 8 of the base member 3 are respectively bonded to each other with a conductive adhesive 13, 13 used as a conductive joining material. According to this embodiment, the conductive adhesive 13 is spread in an outer shape circular in plan view. Accordingly, sections of the crystal piece 2 near the short side 2a are supportably joined to the electrode pads 7 and 8 with the conductive adhesive 13, 13 spread therebetween. Examples of the conductive adhesive 13 are silicone-based and urethane-based adhesives containing silver or gold conductive fillers, and pasty adhesives such as reformed epoxy-based adhesives.

A seating 14 is provided protrudingly on the inner bottom surface 3a1 at a center position of the base member 3 near the short side 2b. An adhesive 16, which is a joining material, is spread on the seating 14 in a circular shape in plan view. Accordingly, the back surface of the crystal piece 2 is supportably joined, at a position thereof near the short side 2b in a predetermined joint region, to the seating 14 with the adhesive 16 spread therebetween. The adhesive 16 may be a conductive adhesive or a non-conductive adhesive. The seating 14 is equal in height to upper ends of the electrode pads 7 and 8 to ensure there is an interval between the crystal piece 2 and an upper surface of the recessed portion 6 of the base member 3 when the crystal piece 2 is horizontally supported on the base member 3. The seating 14 and/or seating portions for the electrode pads 7 and 8 may be omitted.

The back surface of the crystal piece 2 is supportably joined, at positions near the short side 2a, to the electrode pads 7 and 8 of the base member 3 by first and second support portions M1 and M2 formed of the conductive adhesive 13. The back surface is further supportably joined, at a position thereof near the short side 2b, to the seating 14 by an auxiliary support portion S formed of the adhesive 16. Thus, the crystal piece 2 is supported on the base member 3 at three supporting points by two support portions M1 and M2 near the short side 2a and one auxiliary support portion S near the short side 2b. For example, thicknesses of the conductive adhesive 13 and the adhesive 16 are 10 µm to 30 µm. This is a range of thicknesses of these adhesives after the spread adhesives 13 and 16 in pasty form are dried and cured.

In the crystal resonator 1 according to this embodiment wherein the crystal piece 2 is supported on the recessed portion 6 of the base member 3 at three positions; two positions of the first and second support portions M1 and M2, and a position of the auxiliary support portion S. For a better resistance to impact, the auxiliary support portion S is more specifically located as described below.

The auxiliary support portion S defines a predetermined circular joint region, which is situated on a virtual centerline CL connecting center points of the short sides 2a and 2b and to be joined to the back surface of the crystal piece 2. Describing peripheral edges of the circular joint region of the auxiliary support portion S, Sa is a peripheral edge nearest to the short side 2b, and Sb is a peripheral edge farthest from the short side 2b.

Figure 4:
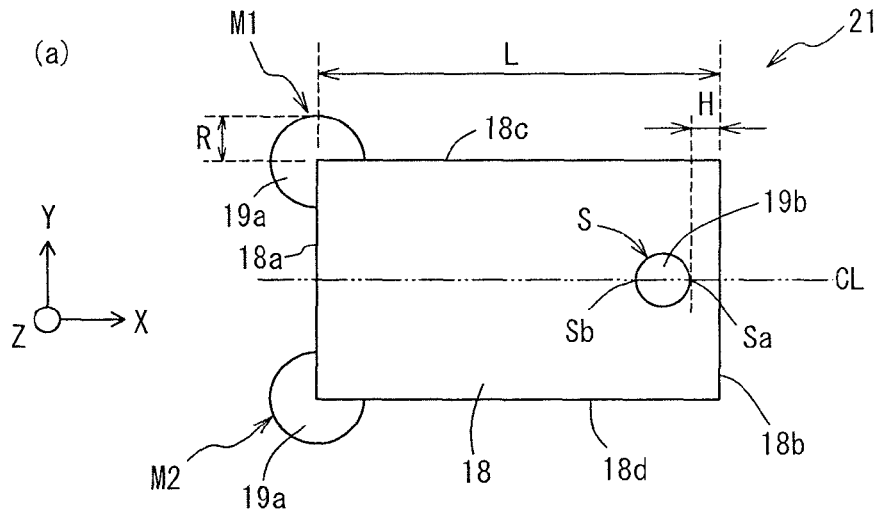
FIG. 4 are plan views of a crystal piece and support portions of the evaluation model.
Figure 4:
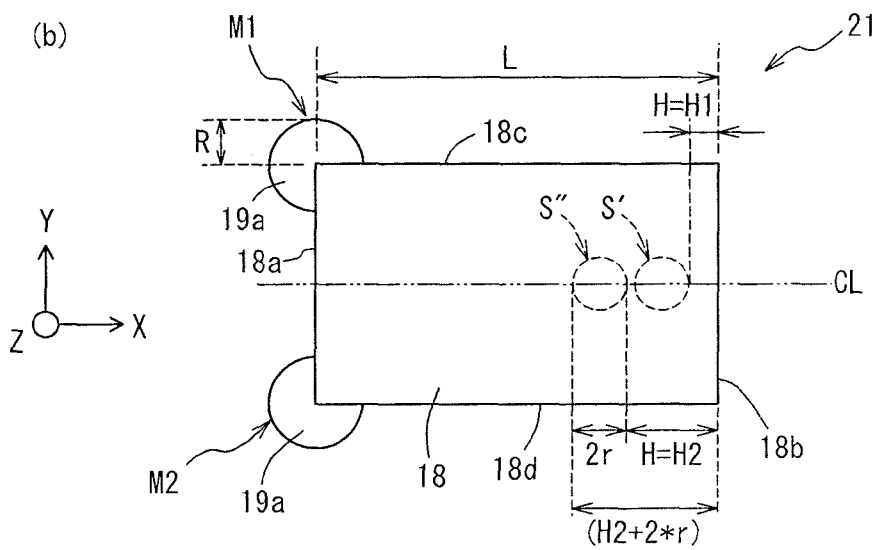

This embodiment is characterized in that the auxiliary support portion S is located relative to the short side 2b at a position at which a value of (H2+2*r)/L expressed in percentage is equal to or smaller than 20%, where L is a distance between the short sides 2a and 2b, H2 is a distance from the short side 2b to the peripheral edge Sa nearest to the short side 2b when the auxiliary support portion S is at a position farthest from the short side 2b (auxiliary support portion S at the position of a dotted circle S" in FIG. 4 (b)), and 2*r is the diameter of auxiliary support portion S (where r is the radius of the auxiliary support portion S). The auxiliary support portion S is preferably located at a position at which the value of (H2+2*r)/L expressed in percentage is equal to or smaller than 19%, and more preferably at a position at which the value of (H2+2*r)/L expressed in percentage is between 2% and 20%.

To evaluate the durability against centrifugal acceleration of the crystal resonator wherein the crystal piece 2 is supported on the base member 3 at three supporting points by the first and second support portions M1 and M2 and the auxiliary support portion S, this embodiment performed a stress simulation according to the finite element method on the assumption that the centrifugal acceleration of 2000 G acted upon the crystal resonator.

The stress simulation employed the assumption that the auxiliary support portion S had, in plan view, a circular outer shape with the radius of r, however, the auxiliary support portion S does not necessarily have a circular shape. The auxiliary support portion S having an elliptical or any non-circular shape should be located at a position at which a value of (H2+D)/L obtained by dividing (H2+D) by the distance L and expressed in percentage is equal to or smaller than 20%, where D is a dimension of the auxiliary support portion S in a direction along the distance L (distance between the farthest and nearest peripheral edges of the auxiliary support portion S). The auxiliary support portion S is preferably located at a position at which the value of (H2+D)/L is equal to or smaller than 19%, and more preferably between 2% and 20%. The position setting of the auxiliary support portion S is basically the same whether its outer shape in plan view is a circular shape or a non-circular shape.

Figure 3:
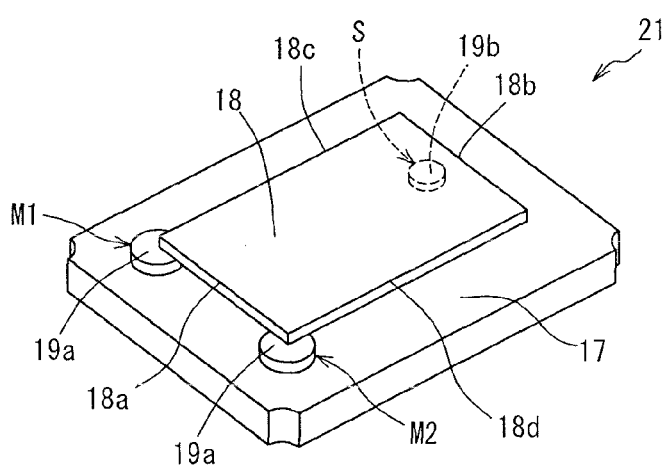
FIG. 3 is a perspective view of a first evaluation model for stress simulation wherein an auxiliary support portion is provided.

FIGS. 3 and 4 are perspective and plan views of an evaluation model 21 prepared for the stress simulation. Describing the evaluation model 21, a crystal piece 18 having an outer shape rectangular in plan view is mounted on a plate-shaped ceramic 17, wherein both end sections of the crystal piece 18 near a short side 18a thereof are respectively supported by first and second support portions M1 and M2 formed of a conductive adhesive 19a, and a center section of the crystal piece 18 near a short side 18b thereof is similarly supported by an auxiliary support portion S formed of a conductive adhesive 19b. For the stress simulation, the position of the auxiliary support portion S was shifted along the virtual centerline CL connecting center points of the short sides 18a and 18b.

In FIG. 4, the auxiliary support portion S is illustrated with a solid line so that its position is more clearly visible. The adhesive 19 of the auxiliary support portion S is spread between the crystal piece 18 and the ceramic 17. Table 1 shows values of the Young's modulus (kgf/mm$^2$) and density (kgf/mm$^3$) representing physical properties of the ceramic 17, crystal piece 18, and adhesives in of the evaluation model 21.

TABLE 1

| | Young's modulus [kgf/mm$^2$] | density [kgf/mm$^3$] |
|---|---|---|
| ceramic | 31.9E3 | 3.6 |
| adhesive | 0.5E3 | 4.3 |
| crystal | 7.9E3 | 2.65 |

In the stress simulation were used two crystal pieces; first and second crystal pieces 18 having outer shapes rectangular in plan view as shown in Table 2. The stress simulation was performed on two evaluation models 21 of first and second sizes with dimensional differences in; size of the rectangular crystal piece 18 (long side*short side), radius R of an adhesive 19a of the support portion M1, M2 circular in plan view, and radius r of an adhesive 19b of the auxiliary support portion S circular in plan view.

TABLE 2

| resonator | first size | (unit: mm) second size |
|---|---|---|
| size of crystal piece (long side * short side) | 1.8 * 1.1 | 2.2 * 1.4 |
| main support portion, adhesive radius (R) | 0.16 | 0.20 |
| auxiliary support portion, adhesive radius (r) | 0.12 | 0.15 |
| main support portion/auxiliary support portion, adhesive thickness | 0.025 | |

Describing the first-size evaluation model 21 referring to Table 2 and FIG. 4, the size of the rectangular crystal piece 18 (long side*short side) was long side length L: 1.8 mm*short side width W: 1.1 mm, radius R of the adhesive 19a of the support portion M1, M2 was 0.16 mm, and radius r of the adhesive 19b of the auxiliary support portion S was 0.12 mm. Describing the second-size evaluation model 21, the size of the rectangular crystal piece 18 was, 2.2 mm*1.4 mm, radius R of the adhesive 19a of the support portion M1, M2 was 0.20 mm, and radius r of the adhesive 19b of the auxiliary support portion S was 0.15 mm. In both of the evaluation models, the adhesives 19a and 19b of the support portions M1 and M2 and the auxiliary support portion S had the thickness of 0.025 mm, and the crystal piece 18 had the thickness of 0.085 mm.

As illustrated in the plan views of FIG. 4, the stress simulation performed a linear static analysis of the position of the auxiliary support portion S for centrifugal acceleration as high as 2000 G when the position of the auxiliary support portion S was shifted on the virtual centerline CL connecting the center points of the short sides 18a and 18b of the crystal piece 18. In FIG. 4 (a) are illustrated the peripheral edges Sa and Sb of the auxiliary support portion S; Sa nearest to the short side 2b, and Sb farthest from the short side 18b. In this drawing, a reference symbol H is a distance from the short side 18b to the nearest peripheral edge Sa. In the illustration of FIG. 4 (b) are used reference symbols, respectively, H1 for the distance H from the nearest peripheral edge Sa to the short side 18b when the position-shifted auxiliary support portion S is at a position nearest to the short side 18b (position illustrated with a dotted circle S'), a reference symbol H2 for the distance H from the nearest peripheral edge Sa to the short side 18b when the position-shifted auxiliary support portion S is at a position farthest from the short side 18b (position illustrated with a dotted circle S"), and a reference symbol 2r for the diameter of the auxiliary support portion S.

Figure 5:
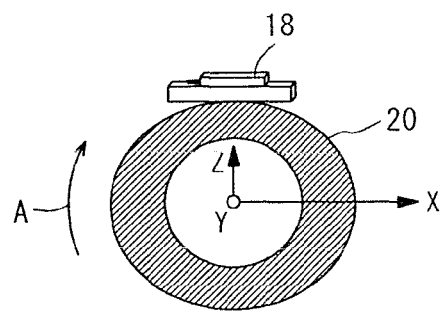
FIG. 5 is an illustration of the evaluation model mounted on a tire.

In the case of using the crystal resonator 1 as a sensor module of a tire pressure monitoring system (TPMS), the crystal resonator 1 is attached to a tire so that, where Y is a direction of rotational axis of a tire 20 rotating in a direction of arrow A, Z is a centrifugal direction of the tire 20, and X is a travelling direction of the tire 20, a width direction of the crystal piece 18 is along the direction of rotational axis Y, and the centrifugal direction Z is orthogonal to upper and lower surfaces of the crystal piece 18, as illustrated in FIG. 5.

FIG. 4 illustrate the respective directions in the stress simulation, wherein the direction of rotational axis Y of the tire is a direction of width of the crystal piece 18 along the short sides 18a and 18b, the travelling direction X of the tire is a direction of length of the crystal piece 18 along the long sides 18c and 18d, and the centrifugal direction z in response to rotation of the tire is a direction vertical to the upper and lower surfaces of the crystal piece 18.

The stress simulation calculated maximum tensile stresses of the adhesives of the support portions M1 and M2 and the auxiliary support portion S and a maximum von Mises stress at the center of the crystal piece 18 when the position of the auxiliary support portion S was shifted.

As the distance H from the short side 18b to the peripheral edge Sa of the auxiliary support portion S nearest to the short side on the centerline CL was defined as a positive (+) value when the peripheral edge Sa of the auxiliary support portion S stayed within the short side 18b but a negative (−) value when the peripheral edge Sa ran off the short side 18b.

The stress simulation result is hereinafter described.

[Simulation Result with First-Size Evaluation Model]

Figure 6:
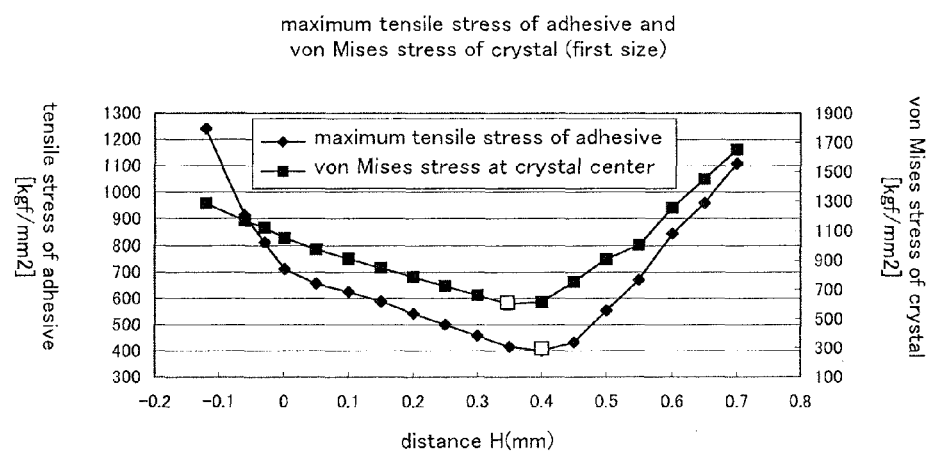
FIG. 6 shows a simulation result with a first-size evaluation model.

Tables 3 to 6 and FIG. 6 show the simulation result obtained with the first-size evaluation model.

TABLE 3

| H [mm] | 1/2 run-off | 1/4 run-off | 1/8 run-off | edge of crystal piece | range of ideal spread positions | | | | | | | | | | | | |
|---|---|---|---|---|---|---|---|---|---|---|---|---|---|---|---|---|---|
| | −0.12 | −0.06 | −0.03 | 0.001 | 0.05 | 0.1 | 0.15 | 0.2 | 0.25 | 0.3 | 0.35 | 0.4 | 0.45 | 0.5 | 0.55 | 0.6 | 0.65 | 0.7 |
| tencile stress of adhesive | 1240 | 914 | 812 | 711 | 656 | 626 | 589 | 542 | 500 | 458 | 417 | 400 | 432 | 553 | 670 | 845 | 960 | 1109 |
| Von Mises stress at crystal center | 1284 | 1168 | 1122 | 1050 | 975 | 910 | 848 | 786 | 724 | 662 | 602 | 615 | 754 | 908 | 1002 | 1256 | 1449 | 1654 | stress: [kgf/mm2]

TABLE 4

| H [mm] | −0.12 | −0.06 | −0.03 | 0.001 | 0.05 | 0.1 | 0.15 | 0.2 | 0.25 | 0.3 | 0.35 | 0.4 | 0.45 | 0.5 | 0.55 | 0.6 | 0.65 | 0.7 |
|---|---|---|---|---|---|---|---|---|---|---|---|---|---|---|---|---|---|---|
| maximum tensile stress of adhesive | 210% | 128% | 103% | 78% | 64% | 57% | 47% | 36% | 25% | 14% | 4% | 0% | 8% | 38% | 68% | 111% | 140% | 177% |
| Von Mises stress at crystal center | 113% | 94% | 86% | 74% | 62% | 51% | 41% | 31% | 20% | 10% | 0% | 2% | 25% | 51% | 66% | 109% | 141% | 175% | stress: [kgf/mm2]

TABLE 5 stress simulation result (first size)

| resonator | within 70% | within 80% |
|---|---|---|
| blank L | 1.8 | 1.8 |
| ideal right-edge distance H1 | 0.05 | 0.001 |
| ideal left-edge distance (H2 + 2 * r) | 0.79 | 0.79 |
| H1/L | 3% | 0% |
| (H2 + 2 * r)/L | 44% | 44% |

TABLE 6

| resonator | within 70% | within 80% |
|---|---|---|
| blank L | 1.8 | 1.8 |
| ideal right-edge distance H1 | 0.05 | 0.001 |
| ideal left-edge distance (H2 + 2 * r) | 0.35 | 0.35 |
| H1/L | 3% | 0% |
| (H2 + 2 * r)/L | 19% | 19% |

Referring to Table 3, the distance H from the auxiliary support portion S to the short side 18b is preferably 0.05 to 0.55 mm. This range of values represents a range of ideal spread positions. The spread position is a position relative to the short side 18b at which the adhesive 19b constituting the auxiliary support portion S of the crystal piece 18 is spread. Of the range of values of the distance H, 0.05 to 0.55 mm, the distance H was 0.4 mm when the maximum tensile stress of the adhesive 19b located within the range of ideal spread positions had the smallest value, 400 (kgf/mm²), and the distance H was 0.35 mm when the maximum von Mises stress at the center of the crystal piece 18 had the smallest value, 602 (kgf/mm²).

Describing the range of ideal spread positions, provided that the smallest stress value of the maximum tensile stress of the adhesive 19b is 0% when the distance H=0.4 mm, the distance H is between 0.05 and 0.55 mm when a stress difference to the stress value 0% is equal to or smaller than 70%, and the distance H is between 0.001 and 0.55 mm when the stress difference is equal to or smaller than 80%. FIG. 6 is a graphical representation of the data of Table 3, which is more visually comprehensible. In this graph, the distance H is plotted on the lateral axis, the adhesive tensile stress is plotted on the vertical axis on the left, and the von Mises stress of the crystal piece is plotted on the vertical axis on the right. The maximum tensile stress of the adhesive 19 at the lowest level when the distance H=0.4 mm increases its stress value whether the distance H is larger or smaller than 0.4 mm. This teaches that the maximum von Mises stress increases its stress value whether the distance H is larger or smaller than from 0.35 mm.

Referring to Table 4, similarly to Table 3, the smallest stress value of the maximum tensile stress of the adhesive 19b, 400 (kgf/mm²), is 0% when the distance H=0.4 mm in the range of 0.05 to 0.55 m, and values of the maximum tensile stress of the adhesive 19b when the distance H is otherwise are expressed in percentage. Further, the smallest stress value of the maximum Mises stress, 602 (kgf/mm²), is 0% when the distance H=0.35 mm, and values of the maximum Mises stress of the adhesive 19b when the distance H is otherwise are expressed in percentage. The columns in Tables 3 and 4 within thick frames each show a preferable range of values.

The stress simulation result is shown in Tables 5 and 6. Table 5 shows various data at the stress differences equal to or smaller than 70% and equal to or smaller than 80%, and the long side of the crystal piece has the dimension of 1.8 mm (blank L). An ideal right-edge distance H1 of the distance H from the short side 18b to the right-side peripheral edge Sa of the auxiliary support portion S on the centerline CL is 0.05 mm when the stress difference is equal to or smaller than 70%, and 0.001 mm when the stress difference is equal to or smaller than 80%. An ideal left-edge distance of the distance H, measured from the short side 18b to the left-side peripheral edge Sb of the auxiliary support portion S, is expressed as (H2+2*r), where H2 is the distance H, and the diameter, 2*r, of the auxiliary support portion S (r is the radius of the auxiliary support portion S) is added thereto. The ideal left-edge distance (H2+2*r) is 0.79 mm (provided that 2*r=0.24 mm, H2=0.55 mm) at the stress differences equal to or smaller than 70% and equal to or smaller than 80% The value of H1/L (in percentage), where L is a distance between the short sides 18a and 18b, is 3% when the stress difference is equal to or smaller than 70%, and 0% when the stress difference is equal to or smaller than 80%. The value of (H2+2*r)/L (in percentage) is 44% at the stress differences equal to or smaller than 70% and equal to or smaller than 80%. In FIG. 4 (*b*) are illustrated the ideal left-edge distance, (H2+2*r), when the peripheral edge Sa of the auxiliary support portion S is positioned away from the short side 18b by H1 and H2.

Table 6 shows the result affected by the formation of driving electrodes in the crystal piece. In contrast to Table 5, the ideal left-edge distance, (H2+2*r), is 0.35 mm at the stress differences equal to or smaller than 70% and equal to or smaller than 80%. Further, the value of (H2+2*r)/L expressed in percentage is 19% at the stress differences equal to or smaller than 70% and equal to or smaller than 80%.

[Simulation Result with Second-Size Evaluation Model]

Figure 7:
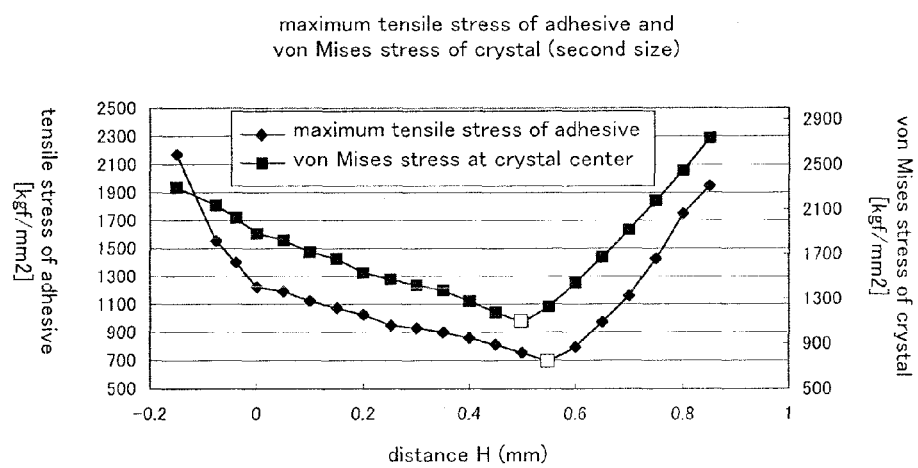
FIG. 7 shows a simulation result with a second-size evaluation model.

Tables 7 to 10 and FIG. 7 show the simulation result obtained with the second-size evaluation model.

TABLE 7

|  | ½ run-off | ¼ run-off | ⅛ run-off | edge of crystal piece | range of ideal spread positions | | | | | | |
|---|---|---|---|---|---|---|---|---|---|---|---|
| H [mm] | -0.15 | -0.08 | -0.038 | 0.001 | 0.05 | 0.1 | 0.15 | 0.2 | 0.26 | 0.3 | 0.35 |
| tensile stress of adhesive | 2170 | 1552 | 1399.7 | 1223 | 1101 | 1123 | 1072 | 1024 | 949 | 929 | 899 |
| Von Mises stress at crystal center | 2295 | 2137 | 2021.9 | 1884 | 1819 | 1717 | 1657 | 1534 | 1471 | 1421 | 1373 |

|  | range of ideal spread positions | | | | | | stress: [kgf/mm2] | | | |
|---|---|---|---|---|---|---|---|---|---|---|
| H [mm] | 0.4 | 0.45 | 0.5 | 0.55 | 0.6 | 0.65 | 0.7 | 0.75 | 0.80 | 0.85 |
| tensile stress of adhesive | 861 | 811 | 752 | 893 | 794 | 973 | 1160 | 1425 | 1751 | 1946 |
| Von Mises stress at crystal center | 1275 | 1177 | 1089 | 1227 | 1443 | 1673 | 1916 | 2177 | 2449 | 2735 |

TABLE 8

|  |  |  |  |  |  |  |  | stress: [kgf/mm2] | | | |
|---|---|---|---|---|---|---|---|---|---|---|---|
| H [mm] | -0.12 | -0.06 | -0.03 | 0.001 | 0.05 | 0.1 | 0.15 | 0.2 | 0.25 | 0.3 | 0.35 |
| maximum tensile stress of adhesive | 213% | 124% | 102% | 77% | 72% | 62% | 55% | 48% | 37% | 34% | 30% |
| Von Mises stress at crystal center | 111% | 96% | 86% | 73% | 67% | 58% | 52% | 41% | 35% | 30% | 26% |

|  | H [mm] | 0.4 | 0.45 | 0.5 | 0.55 | 0.6 | 0.65 | 0.7 | 0.75 | 0.80 | 0.85 |
|---|---|---|---|---|---|---|---|---|---|---|---|
|  | maximum tensile stress of adhesive | 24% | 17% | 9% | 0% | 15% | 40% | 87% | 106% | 153% | 181% |
|  | Von Mises stress at crystal center | 17% | 8% | 0% | 13% | 32% | 54% | 76% | 100% | 125% | 151% |

TABLE 9 stress simulation result (second size)

| resonator | within 70% | within 80% |
|---|---|---|
| blank L | 2.2 | 2.2 |
| ideal right-edge distance H1 | 0.05 | 0.001 |
| ideal left-edge distance (H2 + 2 * r) | 0.95 | 1.00 |
| H1/L | 2% | 0% |
| (H2 + 2 * r)/L | 43% | 45% |

TABLE 10

| resonator | within 70% | within 80% |
|---|---|---|
| blank L | 2.2 | 2.2 |
| ideal right-edge distance H1 | 0.05 | 0.001 |
| ideal left-edge distance (H2 + 2 * r) | 0.45 | 0.45 |
| H1/L | 2% | 0% |
| (H2 + 2 * r)/L | 20% | 20%. |

Tables 7 to 10 are similar to Tables 3 to 6 except the size of evaluation model. Though not particularly described, numeral values in Tables 7 to 10 are not precisely the same as those shown in Tables 3 to 6 by virtue of the size change from the first to second size.

In contrast to Table 6 showing the values of the first-size evaluation model, Table 10 shows the values of the second-size evaluation model; the ideal left-edge distance (H2+2*r) is 0.45 mm at the stress differences equal to or smaller than 70% and equal to or smaller than 80%, H1/L is 2% when the stress difference is equal to or smaller than 70%, and 0% when the stress difference is equal to or smaller than 80%, and the value of (H2+2*r)/L expressed in percentage is 20% at the stress differences equal to or smaller than 70% and equal to or smaller than 80%. Similarly to the correlation between FIG. 6 and Table 3, FIG. 7 is a graphical representation of the data shown in Table 7. These tables, which are otherwise similar to Tables 3 to 6, are not redundantly described.

Referring to Table 6 with the first size and Table 10 with the second size, the ideal left-edge distance (H2+2*r) and the percentage value of (H2+2*r)/L both have larger values as the crystal piece 18 increase in size. This demonstrates that the auxiliary support portion S can be located at a position more spaced from the short side 18b.

Figure 8A:
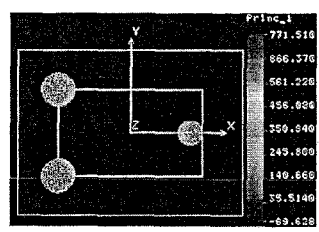
FIGS. 8A (1) to (6) are illustrations of positions of support portions and a von Mises stress distribution of a crystal piece in the first-size evaluation model.
Figure 8A:
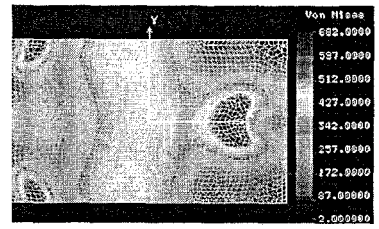
Figure 8A:
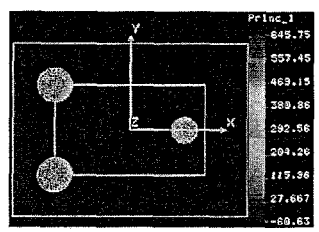
Figure 8A:
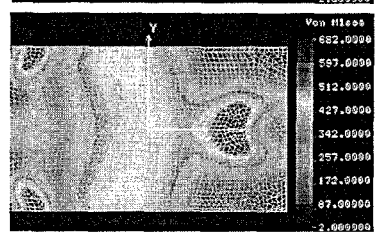
Figure 8A:
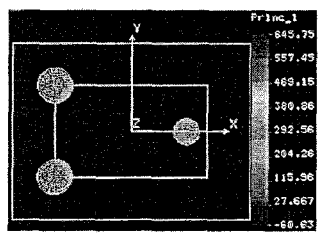
Figure 8A:
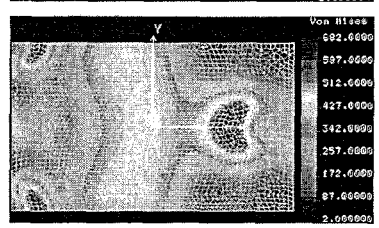
Figure 8A:
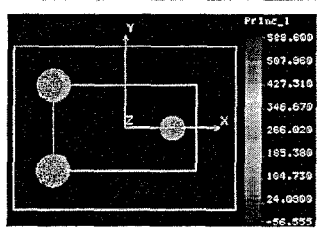
Figure 8A:
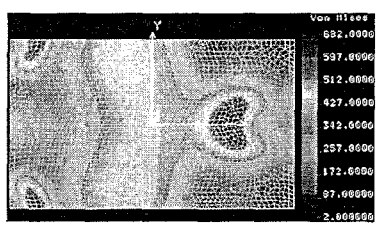
Figure 8A:
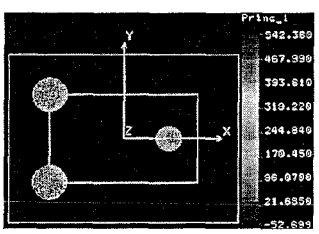
Figure 8A:
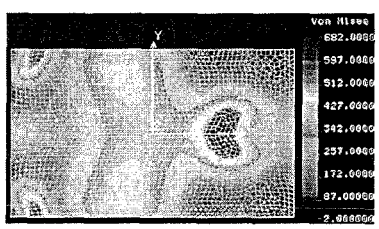
Figure 8A:
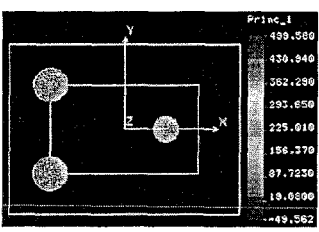
Figure 8A:
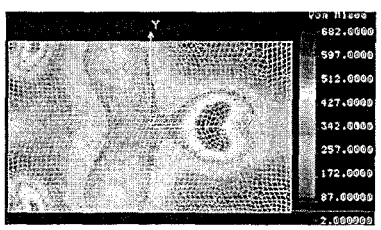
Figure 8B:
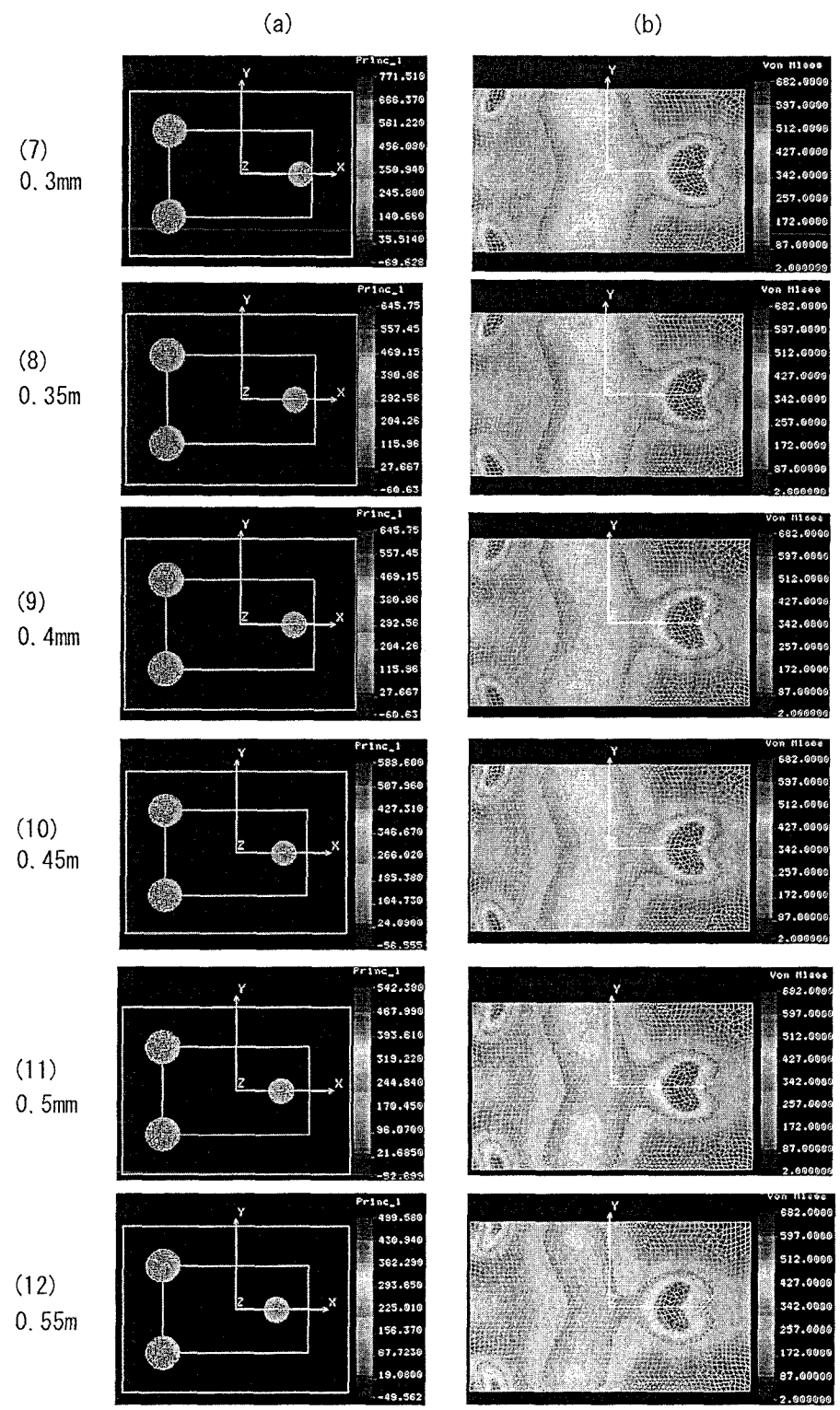
FIGS. 8B (7) to (12) are illustrations of positions of the support portions and a von Mises stress distribution of the crystal piece in the first-size evaluation model.

FIGS. 8A (1) to (6) and FIGS. 8B (7) to (12) illustrate variations in 18 stages of the von Mises stress distribution of the crystal piece 12 when the distance H shown in Table 3 was changed 18 times from −0.02 to 0.7 in the first-size evaluation model. Referring to FIGS. 8A and 8B, the positions of the respective support portions are illustrated in a left-hand row (a), while the von Mises stress distribution of the crystal piece 18 is illustrated in a right-hand row (b). Stepwise color changes from violet to red, as in rainbow colors, expressing increases of the von Mises stress were converted into gray images and shown in these drawings. In the drawings are omitted variations in the von Mises stress distribution of the crystal piece 18 when the distance H of Table 10 changed from −0.15 to 0.85 in the second-size evaluation model.

According to the embodiment described so far, the crystal piece is supported at three supporting points by two support portions and one auxiliary support portion S. Instead, two auxiliary support portions S1 and S2 may be provided to support the crystal piece at four supporting points in total.

Figure 9:
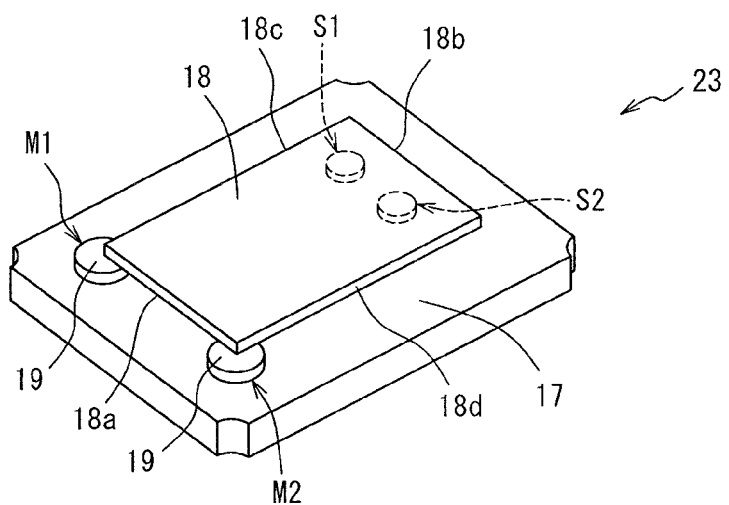
FIG. 9 is a perspective view of another evaluation model for stress simulation wherein two auxiliary support portions are provided.
Figure 10:
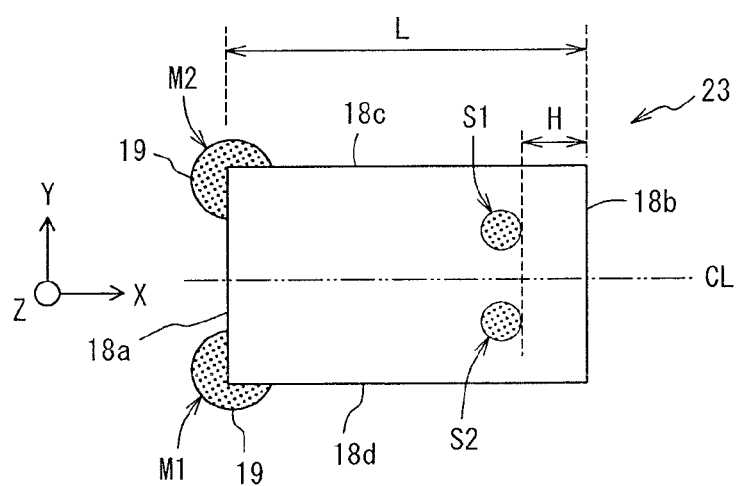
FIG. 10 is a plan view of a crystal piece and support portions of the another evaluation model.

FIGS. 9 and 10 illustrate an evaluation model 23 for 4-point support stress simulation, respectively in perspective and plan views. To support the crystal piece 18, whose outer shape is rectangular in plan view, on a plate-shaped ceramic 17, two end sections of a short side 18a of the crystal piece 18 are supported respectively by first and second support portions M1 and M2 formed of a conductive adhesive 19, and both sides of an opposite short side 18b thereof with respect to the center line CL are supported respectively by first and second auxiliary support portions S1 and S2 formed of the conductive adhesive 19. A stress simulation was performed, wherein positions of the first and second auxiliary support portions S1 and S2 were shifted along the centerline CL between the short sides 18a and 18b.

The adhesives of the first and second auxiliary support portions S1 and S2 were spread between the crystal piece 18 and the ceramic 17. Table 11 shows values of the Young's modulus (kgf/mm$^2$) and density (kgf/mm$^3$) representing physical properties of the ceramic 17, crystal piece 18, and adhesives 19 used for this evaluation model.

TABLE 11

|  | Young's modulus [kgf/mm$^2$] | density [kgf/mm$^3$] |
|---|---|---|
| ceramic | 31.9E3 | 3.6 |
| adhetive | 0.5E3 | 4.3 |
| crystal | 7.9E3 | 2.65 |

As is known from Table 12 below, this stress simulation used two crystal pieces; first and second crystal pieces 18 each having an outer shape rectangular in plan view. The stress simulation was performed on two different evaluation models 21 respectively having first and second sizes with dimensional differences in; size of the rectangular crystal piece 18 (long side*short side), radius R of the adhesive 19 of the support portion M1, M2 circular in plan view, and radius r of the adhesive 19 of the first and second auxiliary support portion S1, S2 circular in plan view.

TABLE 12

| resonator | first size | (unit: mm) second size |
|---|---|---|
| size of crystal piece (long side * short side) | 1.8 * 1.1 | 2.2 * 1.4 |
| main support portion, adhesive radius(R) | 0.16 | 0.20 |
| auxiliary support portion, adhesive radius(r) | 0.12 | 0.15 |
| main support portion/auxiliary support portion, adhesive thickness | 0.025 | |

Referring to Table 19 and FIG. 9, a first-size evaluation model 21 with the rectangular crystal piece 18 had the following dimensions; length L and width W of the crystal piece 18: 1.8 mm*1.1 mm, radius R of the adhesive 19 of the support portion M1, M2: 0.16 mm, and radius r of the adhesive 19 of the first and second auxiliary support portion S1, S2: 0.12 mm.

A second-size evaluation model 21 with the rectangular crystal piece 18 had the following dimensions; length L and width W of the crystal piece 18: 2.2 mm*1.4 mm, radius R of the adhesive 19 of the support portion M1, M2: 0.20 mm, and radius r of the adhesive 19 of the first and second auxiliary support portion S1, S2: 0.15 mm. In both of these evaluation models of different sizes, the adhesives 19 of the support portions M1 and M2 and the first and second auxiliary support portions S1 and S2 had the thickness of 0.025 mm, and the crystal piece 18 had the thickness of 0.085 mm.

This stress simulation performed a linear static analysis of the positions of the first and second auxiliary support portions S1 and S2 for centrifugal acceleration as high as 2000 G when these first and second auxiliary support portions were moved on the virtual centerline CL connecting the center points of the short sides 18a and 18b of the crystal piece 18.

The stress simulation result is hereinafter described.

[Simulation Result with First-Size Evaluation Model]

Figure 11:
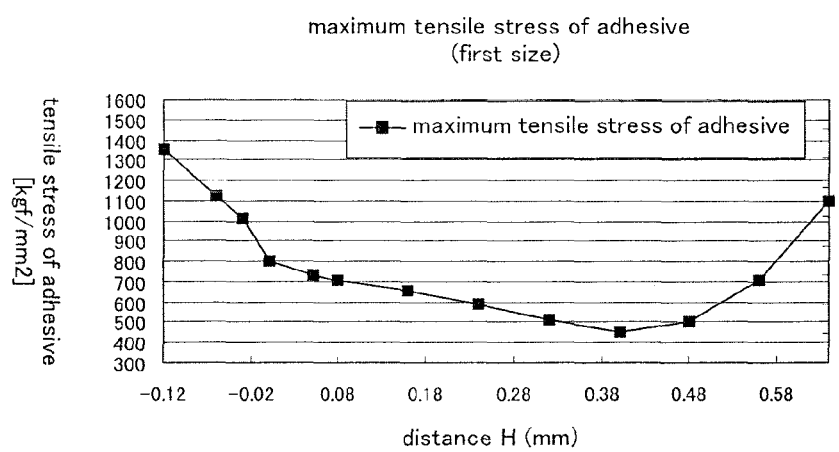
FIG. 11 shows simulation result with another first-size evaluation model.

Tables 13 to 16, and FIG. 11 show the stress simulation result obtained with the first-size evaluation model illustrated in FIGS. 9 and 10 respectively in perspective and plan views.

Though the stress simulation shown in these tables did not measure von Mises stress, resistance to impact can consequently be evaluated from the tensile stress acting upon the adhesive 19 by virtue of correlation between the von Mises stress and the adhesive tensile stress.

Table 13 indicates that the first and second auxiliary support portions S1 and S2 are at ideal positions when the distance H is between 0.05 and 0.56 mm. A range of ideal positions of the first and second auxiliary support portions S1 and S2 is shown in circumscribed in boldface columns. The maximum tensile stress acted upon the adhesives 19 within the range of ideal positions decreases to the minimum, 453 (kgf/mm$^2$), when the distance H is 0.4 mm. FIG. 11 is a graphical representation of the data shown in Table 13. The lateral axis, left vertical axis, and right vertical axis represent the same as FIG. 6. The columns circumscribed in boldface indicate that, where the minimum value of the maximum tensile stress of the adhesive 19 is 100% when the distance H=0.4 mm, a difference of stress to the minimum value is equal to or smaller than 70%. The other columns

TABLE 13

|  | 1/2 run-off | 1/4 run-off | 1/8 run-off | edge of crystal piece | range of ideal spread positions | | | | | | | |
|---|---|---|---|---|---|---|---|---|---|---|---|---|
| H [mm] | −0.12 | −0.06 | −0.03 | 0.001 | 0.05 | 0.08 | 0.16 | 0.24 | 0.32 | 0.4 | 0.48 | 0.56 | 0.64 |
| maximum tensile stress of adhesive | 1351 | 1123.4 | 1012.4 | 797.7 | 737 | 708 | 656 | 588 | 512 | 453 | 502 | 707 | 1101 | stress: [kgf/mm2]

TABLE 14

| H [mm] | −0.15 | −0.075 | −0.0375 | 0.001 | 0.05 | 0.1 | 0.2 | 0.3 | 0.4 | 0.5 | 0.6 | 0.7 | 0.8 |
|---|---|---|---|---|---|---|---|---|---|---|---|---|---|
| maximum tensile stress of adhesive | 199% | 146% | 124% | 76% | 63% | 56% | 45% | 30% | 13% | 0% | 11% | 56% | 143% | stress: [kgf/mm2]

TABLE 15 stress simulation result (first size)

| resonator | within 70% | within 80% |
|---|---|---|
| blank L | 1.8 | 1.8 |
| ideal right-edge distance H1 | 0.05 | 0.001 |
| ideal left-edge distance (H2 + 2 * r) | 0.79 | 0.79 |
| H1/L | 3% | 0% |
| (H2 + 2 * r)/L | 44% | 44% |

TABLE 16

| resonator | within 70% | within 80% |
|---|---|---|
| blank L | 1.8 | 1.8 |
| ideal right-edge distance H1 | 0.05 | 0.001 |
| ideal left-edge distance (H2 + 2 * r) | 0.35 | 0.35 |
| H1/L | 3% | 0% |
| (H2 + 2 * r)/L | 19% | 19% | indicate that the same stress difference is equal to or smaller than 80%. The values of this table, which are similar to those of Table 3, are not described in detail.

Table 14, which is similar to Table 13 as Table 4 to Table 3, is not described in detail. The columns of Tables 13 and 14 in a thickened frame indicate preferable values.

Tables 15 and 16 are similar to Tables 5 and 6, which are not described in detail. Briefly, Table 16 shows that H2+2*r is 0.35 mm at the stress differences equal to or smaller than 70% and equal to or smaller than 80%, and the value of (H2+2*r)/L expressed in percentage is 19% at the stress differences equal to or smaller than 70% and equal to or smaller than 80%.

[Simulation Result with Second-Size Evaluation Model]

Figure 12:
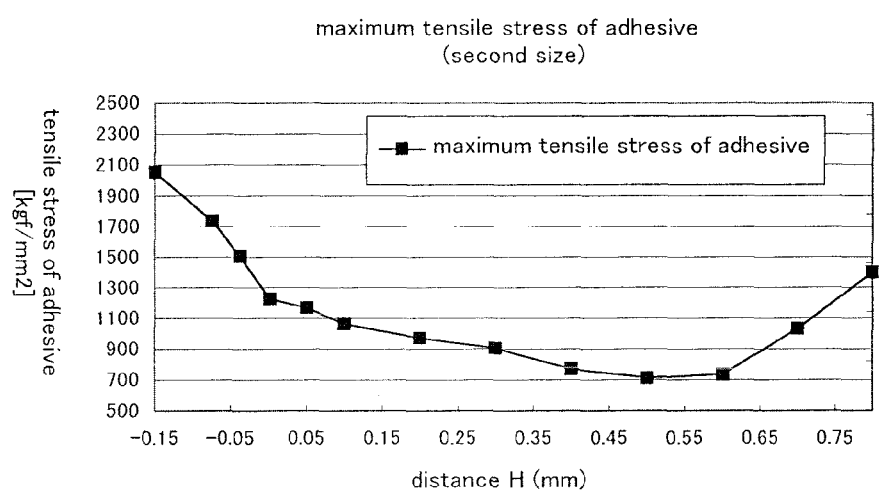
FIG. 12 shows simulation result with another second-size evaluation model.

Tables 17 to 20 and FIG. 12 show the stress simulation result obtained with the second-size evaluation model.

TABLE 17

| | 1/2 run-off | 1/4 run-off | 1/8 run-off | edge of crystal piece | range of ideal spread positions | | | | | | | |
|---|---|---|---|---|---|---|---|---|---|---|---|---|
| H [mm] | −0.15 | −0.075 | −0.0375 | 0.001 | 0.05 | 0.1 | 0.2 | 0.3 | 0.4 | 0.5 | 0.6 | 0.7 | 0.8 |
| maximum tensile stress of adhesive | 2055 | 1737 | 1507 | 1226.7 | 1168 | 1063 | 970 | 904 | 768 | 712 | 736 | 1031 | 1401 | stress: [kgf/mm2]

TABLE 18

| H [mm] | −0.15 | −0.075 | −0.0375 | 0.001 | 0.05 | 0.1 | 0.2 | 0.3 | 0.4 | 0.5 | 0.6 | 0.7 | 0.8 |
|---|---|---|---|---|---|---|---|---|---|---|---|---|---|
| maximum tensile stress of adhesive | 189% | 144% | 112% | 72% | 64% | 49% | 36% | 27% | 8% | 0% | 3% | 45% | 97% | stress: [kgf/mm2]

TABLE 19 stress simulation result (second size)

| resonator | within 70% | within 80% |
|---|---|---|
| blank L | 2.2 | 2.2 |
| ideal right-edge distance H1 | 0.05 | 0.001 |
| ideal left-edge distance (H2 + 2 * r) | 1.00 | 1.00 |
| H1/L | 2% | 0% |
| (H2 + 2 * r)/L | 45% | 45% |

TABLE 20

| resonator | within 70% | within 80% |
|---|---|---|
| blank L | 2.2 | 2.2 |
| ideal right-edge distance H1 | 0.05 | 0.001 |
| ideal left-edge distance (H2 + 2 * r) | 0.45 | 0.45 |
| H1/L | 2% | 0% |
| (H2 + 2 * r)/L | 20% | 20% |

Tables 17 to 20, which are similar to Tables 13 to 16, are not described in detail. Briefly, Table 20 shows that, in contrast to the first size, H2+2*r is 0.45 mm at the stress differences equal to or smaller than 70% and equal to or smaller than 80%, H1/L is 2% when the stress difference is equal to or smaller than 70%, and 0% when the stress difference is equal to or smaller than 80%, and the value of (H2+2*r)/L expressed in percentage is 20% at the stress differences equal to or smaller than 70% and equal to or smaller than 80%. FIG. 12 is a graphical representation of the data shown in Table 17.

Figure 13A:
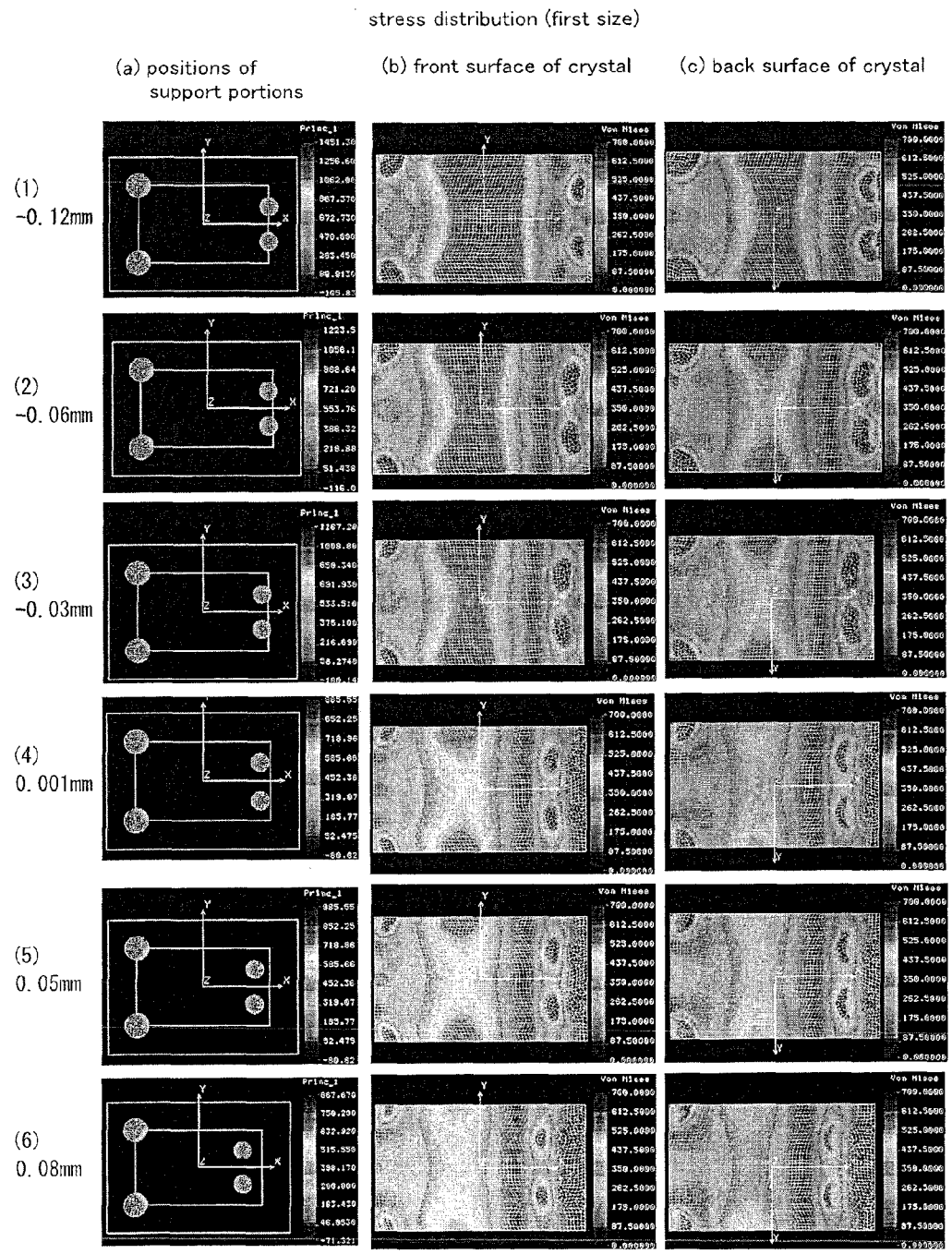
FIGS. 13A (1) to (6) are illustrations of positions of support portions and a von Mises stress distribution of a crystal piece in the another first-size evaluation model.
Figure 13B:
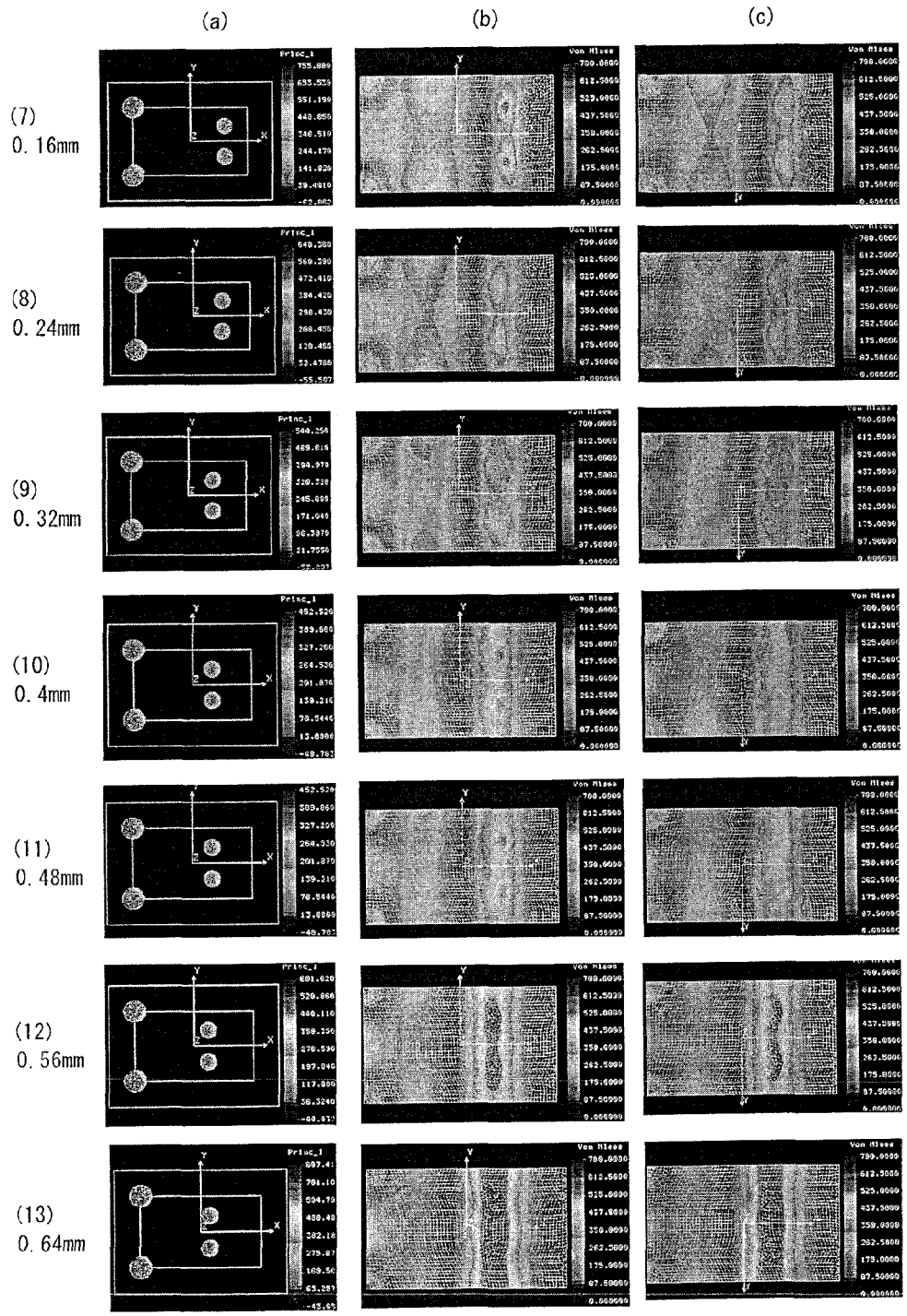
FIGS. 13B (7) to (13) are illustrations of positions of the support portions and a von Mises stress distribution of the crystal piece in the another first-size evaluation model.

FIGS. 13A (1) to (6) and FIGS. 13 (7) to (13) illustrate variations of the von Mises stress distribution of the crystal piece 18 when the distance H shown in Table 13 was changed 13 times from −0.12 to 0.001 and then to 0.56 in the first-size evaluation model. Referring to FIGS. 13A and 13B, the positions of the respective support portions are illustrated in a left-hand row (a), while the von Mises stress distributions on the front and back surfaces of the crystal piece 18 are illustrated in right-hand rows (b) and (c) similarly to FIG. 8. As with FIG. 8, variations of the von Mises stress of the crystal piece 18 are illustrated in FIG. 13, and stepwise color changes from violet to red, as in rainbow colors, expressing increases of the von Mises stress were converted into gray images and shown in these drawing.

Figure 14A:
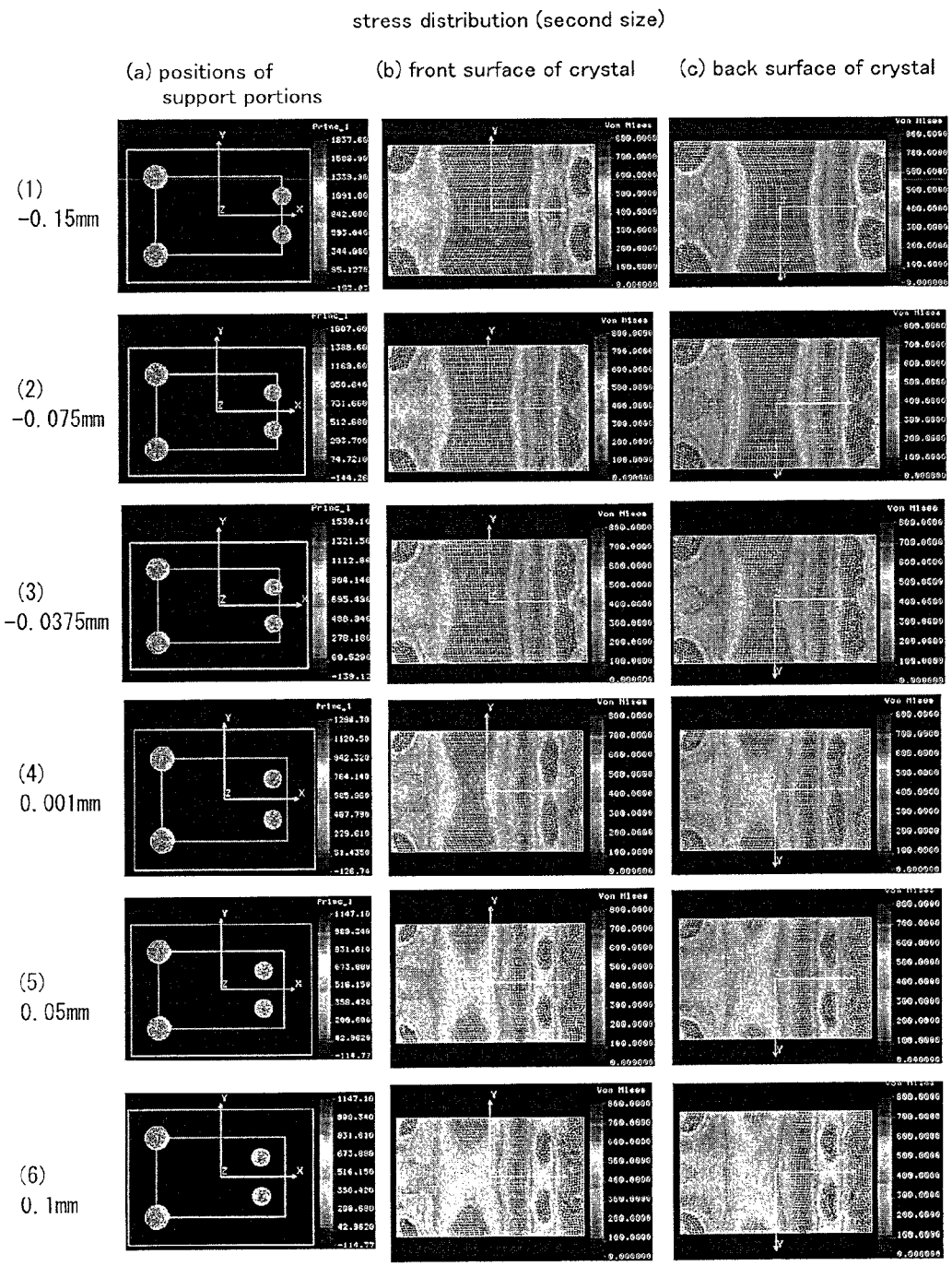
FIGS. 14A (1) to (6) are illustrations of positions of support portions and a von Mises stress distribution of a crystal piece in the another second-size evaluation model.
Figure 14B:
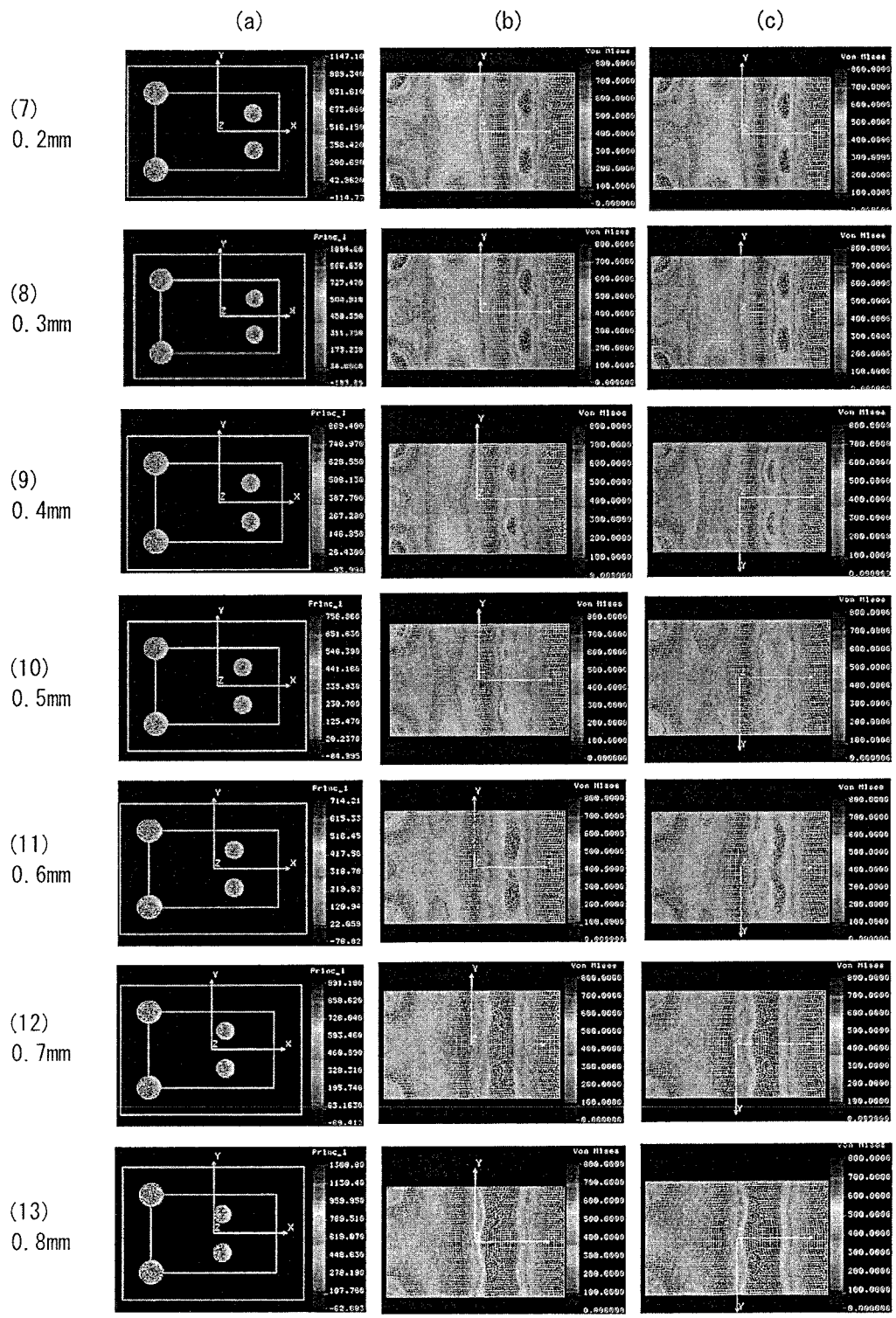
FIGS. 14B (7) to (13) are illustrations of positions of the support portions and a von Mises stress distribution of the crystal piece in the another second-size evaluation model.

FIGS. 14A (1) to (6) and FIGS. 14 (7) to (13) illustrate variations of the von Mises stress distribution of the crystal piece 18 as the distance H of Table 17 was changed 13 times from −0.15 to 0.8 in the second-size evaluation model. Referring to FIGS. 14A and 14B, the positions of the respective support portions are illustrated in a left-hand row (a), while the von Mises stress distribution on the front and back surfaces of the crystal piece 18 is illustrated in right-hand rows (b) and (c).

As described so far, the crystal resonator according to the embodiment is provided with at least one auxiliary support portion S located in a predetermined region. This structure alleviates the tensile stress acting upon the adhesives of the support portions and the von Mises stress acting upon the crystal piece under centrifugal acceleration as high as 2000 G, thereby improving the resistance to impact of the crystal resonator.

The crystal resonator is accordingly a suitable device in environments which demand remarkable impact resistances, particularly in vehicles, for example, TPMS (Tire Pressure Monitoring systems) subject to high centrifugal acceleration, and systems subject to drop impacts such as keyless entry systems wherein wireless transmission enables locking and unlocking instead of the insertion of keys into keyholes.

The piezoelectric device according to the invention, which is a piezoelectric oscillator such as a crystal oscillator, is preferably provided with an integrated circuit for driving the crystal piece, wherein the integrated circuit is joined to the base member and electrically connected to the crystal piece.

Though not illustrated in the drawings, the base member of the crystal oscillator preferably has, in the lower direction of the crystal piece, a space for housing the integrated circuit, and the integrated circuit is housed in the space of the base member. Then, the crystal piece is supported as described so far, and the crystal oscillator is air-tightly sealed with the cover.

Figure 15:
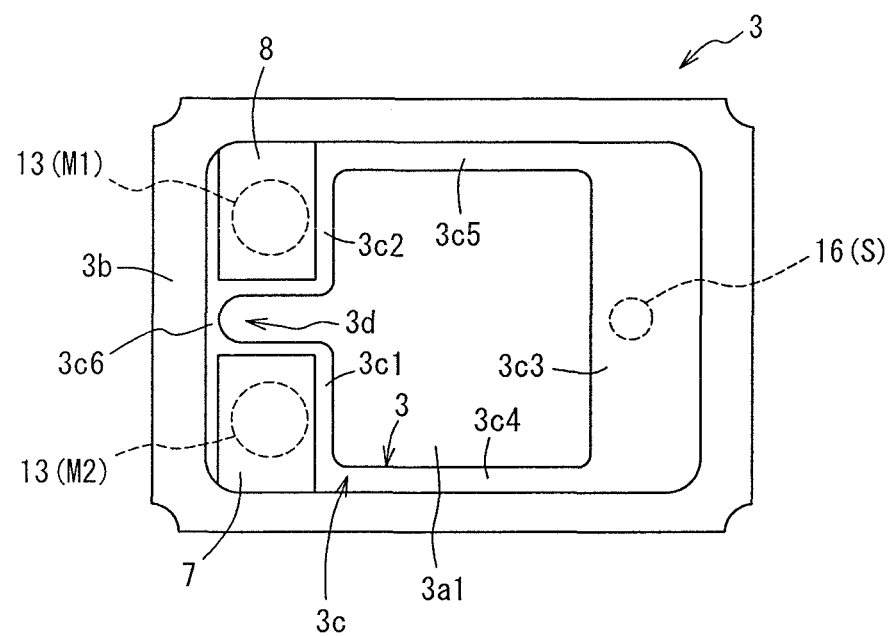
FIG. 15 is a plan view of a modified example of the base member illustrated in FIG. 1.

According to the embodiment described thus far, a whole part of the inner bottom surface 3a1 of the bottom portion 3a in the base member 3 but the seating 14 has a flat shape, and the electrode pads 7 and 8 are formed on the flat inner bottom surface 3a1. As illustrated in FIG. 15, a step portion 3c, which is larger in height than the inner bottom surface 3a1, may be formed along the whole outer-peripheral circumference of the inner bottom surface 3a1, wherein the electrodes 7 and 8, first and second support portions M1 and M2, and auxiliary support portion S are formed on the step portion 3c.

The step portion 3c has a pair of steps 3c1 and 3c2 where the electrode pads 7 and 8 are formed, a step 3c3 where the auxiliary support portion S is formed, and steps 3c4 to 3c6 bridging these steps 3c1 to 3c3. The steps 3c1 to 3c3 are large in width, whereas the steps 3c4 to 3c6 are small in width. When the thin step 3c6 bridges the wide steps 3c1 and 3c2, a recessed portion 3d, in which the inner bottom surface 3a1 is exposed, is formed between them.

The electrode pads 7 and 8 are formed on the steps 3c1 and 3c2, and the conductive adhesive 13 is spread on the electrode pads 7 and 8 so that the first and second support portions M1 and M2 are formed. During the process, the conductive adhesive 13 may accidentally flow out before curing. According to the structure where these steps are formed, the adhesive thus flowing out is effectively dammed up by the recessed portion 3d.

Figure 16:
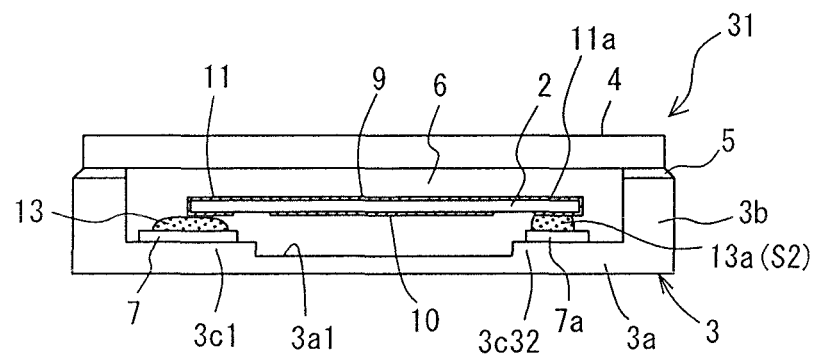
FIG. 16 is a sectional view of a crystal resonator wherein two auxiliary support portions are provided and have electrical continuity with driving electrodes of a crystal piece.
Figure 17:
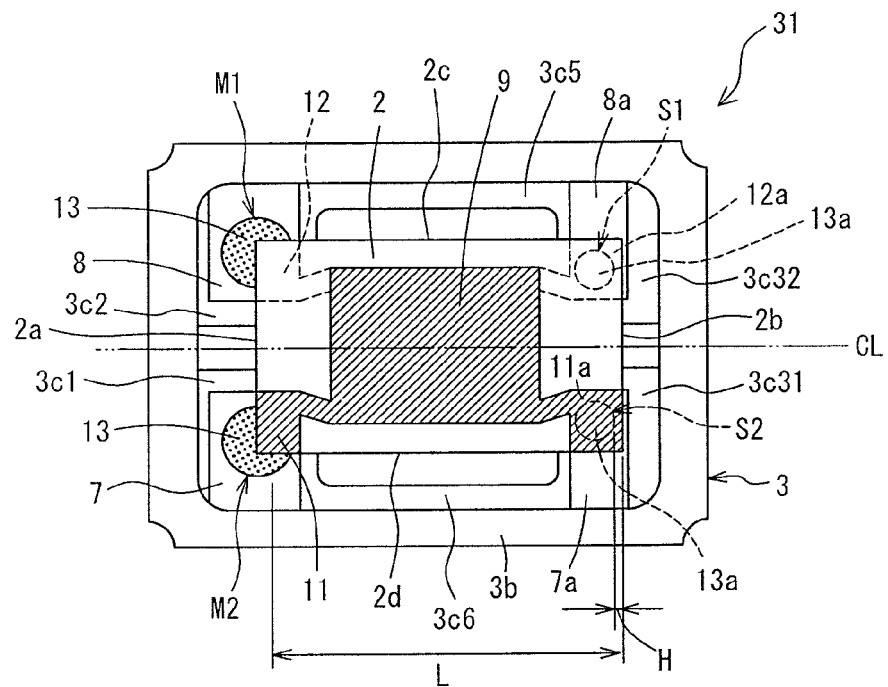
FIG. 17 is a plan view of the crystal resonator illustrated in FIG. 16 after a cover is removed.

Hereinafter, a crystal resonator according to another embodiment of the invention is described in detail referring to FIGS. 16 and 17. FIG. 16 is a sectional view of the crystal resonator, and FIG. 17 is a plan view of the crystal resonator illustrated in FIG. 16 after a package cover is removed. Any structural elements of these drawings, which are similar or identical to those of FIGS. 1 and 2, are illustrated with the same reference symbols. As with the crystal resonator 23 of FIGS. 9 and 10, a crystal resonator 31 according to this embodiment has two first and second auxiliary support portions S1 and S2. A base member 3 of this crystal resonator has, similarly to the base member of FIG. 15, steps 3c1 to 3c6 formed on the inner bottom surface 3a1. Instead of the step 3c3 illustrated in FIG. 15, the base member 3 has steps 3c31 and 3c32 which are provided correspondingly to the first and second auxiliary support portions S1 and S2.

As with the crystal resonator 31 of FIGS. 9 and 10, the first and second auxiliary support portions S1 and S2 are used in the crystal resonator 31 according to this embodiment to support positions of the crystal piece 2 near the short side 2b thereof. Moreover, the first and second auxiliary support portions S1 and S2 have electrical continuity with the driving electrodes 9 and 10 of the crystal piece 2.

In addition to the extraction electrodes 11 and 12 for respectively extracting the driving electrodes 9 and 10 of the crystal piece 2 toward the short side 2a, the crystal resonator 31 has auxiliary extraction electrodes 11a and 12a for respectively extracting the driving electrodes toward the short side 2b. Other than the electrode pads 7 and 8 provided correspondingly to the extraction electrodes 11 and 12 on the steps 3c1 and 3c2 of the base member 3, the crystal resonator 31 has auxiliary electrode pads 7a and 8a provided correspondingly to the auxiliary extraction electrodes 11a and 12a on the steps 3c31 and 3c32 of the base member 3.

The electrode pads 7 and 8 and the extraction electrodes 11 and 12 of the crystal piece 2 are respectively joined to each other with conductive adhesives 13 and 13 constituting the first and second support portions M1 and M2. The auxiliary electrode pads 7a and 8a and the auxiliary extraction electrodes 11a and 12a are respectively joined to each other with conductive adhesives 13a and 13a constituting the first and second auxiliary support portions S1 and S2.

In the crystal resonator 31 thus structured, the driving electrodes 9 and 10 are respectively extracted by the extraction electrodes 11 and 12 to the short side 2a of the crystal piece 2 and electrically continued to outside through the electrode pads 7 and 8. The driving electrodes 9 and 10 are also respectively extracted by the auxiliary extraction electrodes 11a and 12a toward the short side 2b of the crystal piece 2 and electrically continued to outside through the auxiliary electrode pads 7a and 8a. The conductive adhesives 13 and 13 serve as the first and second support portions M1 and M2, and the auxiliary conductive adhesives 13 and 13 serve as the first and second auxiliary support portions S1 and S2.

The crystal resonator 31 thus structured is advantageous in that the crystal piece 2 is supported at four supporting points by the first and second support portions M1 and M2 and the first and second auxiliary support portions S1 and S2, and electrical continuity is established at these four points. When the crystal resonator 31 is acted upon by a high centrifugal acceleration, therefore, the electrical continuity near one of the short sides 2a and 2b of the crystal piece 2 may be lost, however, the electrical continuity near the other side remains uncompromised. Then, the crystal resonator 31 is still useful, fully exerting the functions, and a higher resistance to impact is ensured.

The position setting described earlier is applied to the crystal resonator 31 as well. More specifically, where H is a distance from the short side 2b of the crystal piece 2 to the peripheral edges Sa1 and Sa2 of the first and second auxiliary support portions S1 and S2, L is a distance between the short sides 2a and 2b, 2r is a diameter of each of the first and second auxiliary support portions S1, S2, and, of a range of distances in which the maximum tensile stresses acting upon the first and second auxiliary support portions S1 and S2 and the maximum von Mises stress at the center of the crystal piece 2 are respectively within predetermined ranges of stress values, H2 is the distance H in which these stresses are increased to the largest values of the range of distances, the first and second auxiliary support portions S1 and S2 are located at positions at which the value of (H2+2*r)/L expressed in percentage is equal to or smaller than 20%.

The first and second auxiliary support portions S1 and S2 may be located, for a better resistance to impact, at positions different to those described in the embodiment. More specifically, the first and second auxiliary support portions S1 and S2, where a distance between the opposing long sides 2c and 2d of the crystal piece 2 is 100%, and distances from the long sides 2c and 2d to the centerline CL are respectively 50%, may be located in regions whose distances from the opposing long sides of the crystal piece 2 respectively on the same sides as the auxiliary support portions S1 and S2 with respect to the centerline CL are equal to or smaller than 43%, or preferably between 5% and 39%.

Figure 18:
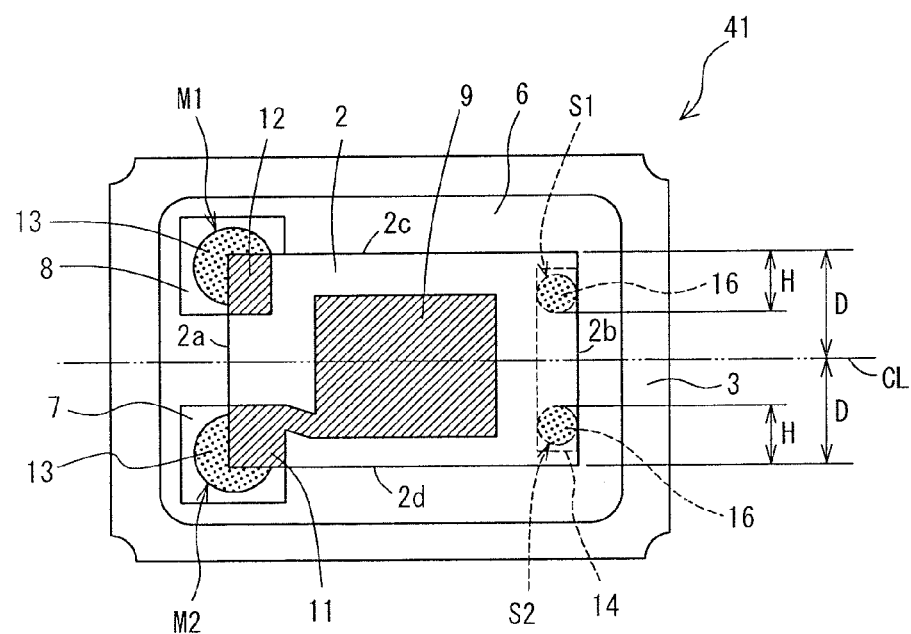
FIG. 18 is a plan view of a crystal resonator illustrated to describe a structure in which two auxiliary support portions are provided and located at positions in a direction along short sides of a crystal piece.

The positions of the first and second auxiliary support portions S1 and S2 are described referring to FIG. 18 and the drawings that follow. To improve the resistance to impact of a crystal resonator 41 illustrated in the drawing, the positions of the support portions M1, M2, S1, and S2, particularly, the positions of the auxiliary support portions S1 and S2 are defined as described below.

According to this embodiment, as illustrated in FIG. 18, where a distance D from the long side 2c, 2d of the rectangular crystal piece 2 to the centerline CL is 50%, meaning that a width dimension of the crystal piece 2 which is a length of the short side 2a, 2b is 100%, the first and second auxiliary support portions S1 and S2 are located in regions whose distances from the long sides 2c and 2d of the crystal piece 2 respectively on the same sides as the auxiliary support portions S1 and S2 with respect to the centerline CL are equal to or smaller than 43%. More specifically, the first auxiliary support portion S1 is located in a region whose distance H from the long side 2c is equal to or smaller than 43%, and the auxiliary support portion S2 is located in a region whose distance H from the long side 2d is equal to or smaller than 43%.

When the first and second auxiliary support portions S1 and S2 are located in these regions, the joining materials of the first and second auxiliary support portions S1 and S2 are located in these regions as well. More specifically, outer shapes in plan view of the joining materials, which are pasty adhesives, after being spread, dried, and cured (projected shapes), are situated within these regions.

The first and second auxiliary support portions S1 and S2 are preferably located in regions whose distances H from the long sides 2c and 2d respectively on the same sides as the auxiliary support portions S1 and S2 with respect to the centerline CL are preferably between 5% and than 39%.

To evaluate the crystal resonator wherein the crystal piece 2 is supported on the support member 3 by the main support portions M1 and M2 and the auxiliary support portions S1 and S2, a stress simulation was performed to specifically evaluate its durability against centrifugal acceleration according to the finite element method on the assumption that the centrifugal acceleration of 2000 G was applied.

Figure 19:
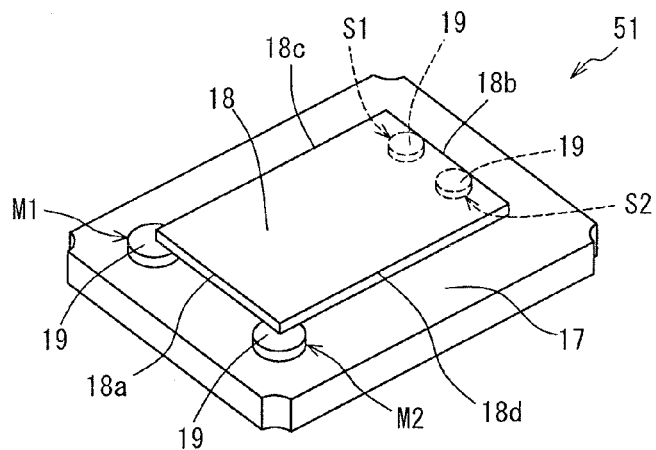
FIG. 19 is a perspective view of an evaluation model for stress simulation.

An evaluation model 51 was prepared for this stress simulation. Describing the evaluation model 51 illustrated in FIGS. 19 and 20 in perspective and plan views, both end sections of a crystal piece 18 near a short side 18a having an outer shape rectangular in plan view were supported on a plate-shaped ceramic 17 by conductive adhesives 19 constituting the first and second support portions M1 and M2, and the other two end sections thereof near a short side 8b were similarly supported by conductive adhesives 19 constituting the first and second auxiliary support portions S1 and S2. During the stress simulation, the positions of the first and second auxiliary support portions S1 and S were shifted along the short side 18b.

Figure 20:
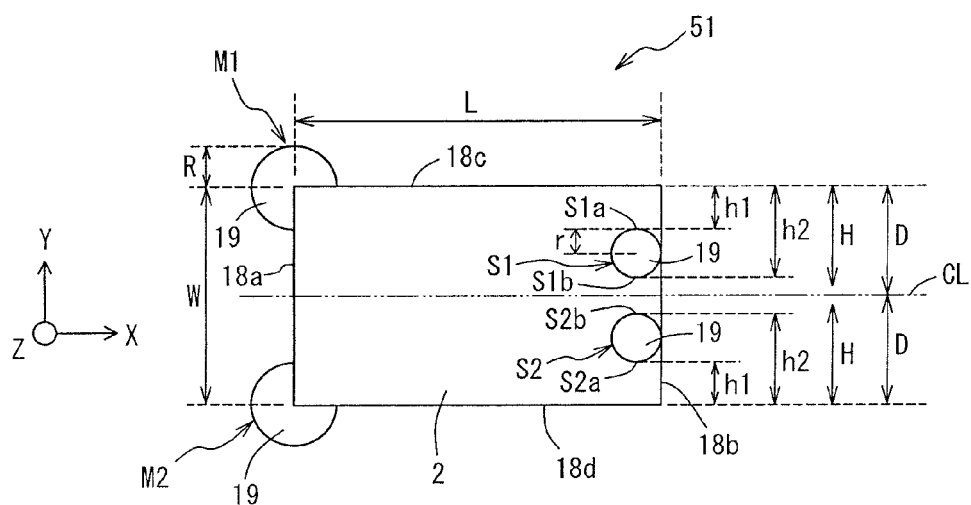
FIG. 20 is a plan view of a crystal piece and support portions of the evaluation model.

In FIG. 20, the first and second auxiliary support portions S1 and S2 are illustrated with solid lines to clearly show their positions. The adhesives 19 of the first and second auxiliary support portions S1 and S2 are spread between the crystal piece 18 and the ceramic 17.

Table 21 shows values of the Young's modulus (kgf/mm$^2$) and density (kgf/mm$^3$) representing physical properties of the ceramic 17, crystal piece 18, and adhesives 19 of the evaluation model 21.

TABLE 21

|  | Young's modulus [kgf/mm$^2$] | density [kgf/mm$^3$] |
| --- | --- | --- |
| ceramic | 31.9E3 | 3.8 |
| adhesive | 0.5E3 | 4.3 |
| crystal | 7.9E3 | 2.65 |

In the stress simulation test were used two crystal pieces 18, whose outer shapes were rectangular in plan view as shown in Table 22. The stress simulation was performed on two different evaluation models 21 of first and second sizes which were different in; size of the rectangular crystal piece 18 (long side*short side), radius R of the adhesive 19a circular in plan view in the support portion M1, M2, and radius r of the adhesive 19b circular in plan view in the first, second auxiliary support portion S1, S2.

TABLE 22

| resonator | first size | second size (unit: mm) |
| --- | --- | --- |
| size of crystal piece (long side * short side) | 1.8 * 1.1 | 2.2 * 1.4 |
| main support portion, adhesive radius(R) | 0.16 | 0.20 |
| auxiliary support portion, adhesive radius(r) | 0.12 | 0.15 |
| main support partion/auxiliary support portion, adhesive thickness | 0.025 | |

Describing the first-size evaluation model 51 referring to Table 22 and FIG. 20, the size of the rectangular crystal piece 18 (long side*short side), which is specifically a length L and a width W, was 1.8 mm*1.1 mm, the radius R of the adhesive 19 of the main support portion M1, M2 was 0.16 mm, and the radius r of the adhesive 19 of the auxiliary support portion S1, S2 was 0.12 mm. Describing the second-size evaluation model 21, the size of the rectangular crystal piece 18 was 2.2 mm*1.4 mm, the radius R of the adhesive 19 of the main support portion M1, M2 was 0.20 mm, and the radius r of the adhesive 19 of the auxiliary support portion S1, S2 was 0.15 mm. In both of the evaluation models, the thicknesses of the adhesives 19 and 19 of the support portions M1 and M2 and the auxiliary support portions S1 and S2 were 0.025 mm, and the thickness of the crystal piece 18 was 0.085 mm.

As illustrated in the plan view of FIG. 20, the stress simulation performed a linear static analysis of the positions of the auxiliary support portions S1 and S2 for centrifugal acceleration as high as 2000 G when the positions of these auxiliary support portions were shifted in a distance h1 on the virtual centerline CL of the crystal piece 18. More specifically, the positions were shifted, from the long sides 18c and 18d of the crystal piece 18 respectively on the same sides as the auxiliary support portions S1 and S2 with respect to the centerline CL connecting the center points of the short sides 18a and 18b, to the peripheral edges S1a and S2a of the circular adhesives 19 constituting the first and second auxiliary support portions S1 and S2 respectively near the long sides 18c and 18d (this distance may be hereinafter called, "near peripheral edge distance").

The first and second auxiliary support portions S1 and S2 are at positions line-symmetric to the centerline CL. Therefore, the near peripheral edge distances h1 of the first and second auxiliary support portions S1 and S2 are equal to each other. Further, the first and second auxiliary support portions S1 and S2 are located at an edge of the rectangular crystal piece 18 near the short side 18b.

In contrast to the near peripheral edge distance h1, distances h2 from the long sides 18c and 18d of the crystal piece 18 respectively on the same sides as the auxiliary support portions S1 and S2 with respect to the centerline CL to the peripheral edges S1b and S2b of the adhesives 19 constituting the auxiliary support portions S1 and S2 distant from the long sides 18c and 18d (this distance may be hereinafter called "distant peripheral edge distance") is obtained by adding the diameter of the adhesive 19 of the auxiliary support portion S1, S2, (2×r), to the near peripheral edge distance h1 as illustrated in FIG. 20. The diameter, (2×r), is more specifically 0.24 (=0.12×2) mm in the first-size evaluation model, and 0.30 (=0.15×2) mm in the second-size evaluation model.

Figure 21:
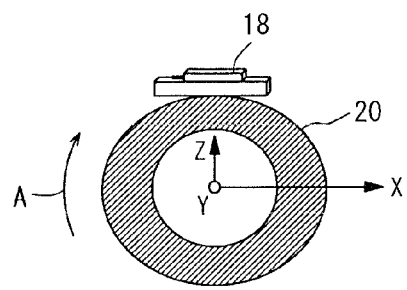
FIG. 21 is an illustration of the evaluation model mounted on a tire.

In the event that the crystal resonator 1 is attached to a tire 20 as a sensor module of a tire pressure monitoring system (TPMS), as illustrated in FIG. 21, where Y is a direction of rotational axis of the tire 20 rotating in a direction of arrow A, Z is a centrifugal direction of the tire 20, and X is a travelling direction of the tire 20, the crystal resonator 1 is attached to the tire so that a width direction of the crystal piece 18 is along the direction of rotational axis Y, and the centrifugal direction Z is orthogonal to upper and lower surfaces of the crystal piece 18.

The respective directions are illustrated in FIG. 20, wherein the direction of rotational axis Y of the tire is the width direction of the crystal piece 18 along the short sides 18a and 18b of the crystal piece 18, the travelling direction X of the tire is a length direction of the crystal piece 18 along the long sides 18c and 18d, and the centrifugal direction Z in response to rotation of the tire is a direction vertical to the upper and lower surfaces of the crystal piece 18.

The stress simulation calculated maximum tensile stresses of the adhesives 19 of the support portions M1 and M2 and the auxiliary support portions S1 and S2 and a maximum von Mises stress at the center of the crystal piece 18 when the positions of the auxiliary support portions S1 and S2 were shifted. The center region of the crystal piece 18 was defined as a region within the radius of 0.3 mm from the center of the rectangular crystal piece 18.

The distance h1 measured from the long side 18a, 18b of the rectangular crystal piece 18 to the peripheral edge S1a, S2a of the auxiliary support portion S1, S2 respectively near the long side 18c, 18d was defined as a positive (+) value when the auxiliary support portion S1, S2 stayed within the rectangular crystal piece 18 but a negative (−) value when the auxiliary support portion S1, S2 was partly located outside of the rectangular crystal piece 18, in other words, when the auxiliary support portion S1, S2 was partly was beyond the rectangular crystal piece 18.

The stress simulation result is hereinafter described.

[Simulation Result with First-Size Evaluation Model]

Table 23 shows the simulation result obtained with the first-size evaluation model.

TABLE 23

| stress: [kgf/mm$^2$] | | | | | | | | | | | |
|---|---|---|---|---|---|---|---|---|---|---|---|
| −0.12 | −0.06 | −0.03 | 0.001 | 0.01 | 0.06 | 0.1 | 0.14 | 0.18 | 0.22 | 0.26 | 0.3 |
| 1355 | 1172 | 1145 | 1123 | 1122 | 1102 | 1094 | 1092 | 1093 | 1101 | 1114 | 1130 |
| 585 | 535 | 527 | 520 | 517 | 511 | 509 | 509 | 511 | 516 | 523 | 533 |

Table 23 shows the distances measured from the respective long sides 18c and 18d of the crystal piece 18 respectively on the same sides as the auxiliary support portions S1 and S2 with respect to the centerline CL to the peripheral edges S1a and S2a of the first and second auxiliary support portions S1 and S2 respectively near the long sides 18c and 18d, and maximum tensile stress of the adhesive 19 and maximum von Mises stress at the center of the crystal piece 18 varying with the near peripheral edge distance h1. The hatched columns show a preferable range of values of the near peripheral edge distance h1.

Figure 22:
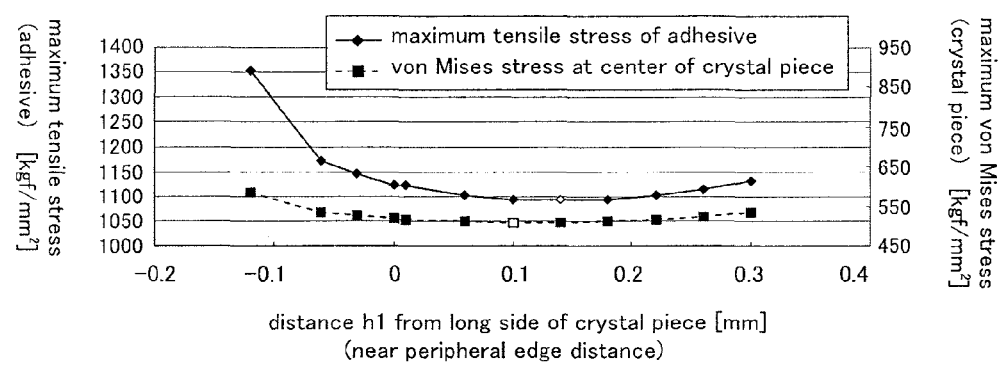
FIG. 22 shows a simulation result with a first-size evaluation model.

FIG. 22 is a graphical representation of the data of Table 23, showing the maximum tensile stress of the adhesive 19 and the maximum von Mises stress at the center of the crystal piece 18 varying with the near peripheral edge distance h1. In FIG. 22, white marks respectively indicate smallest values.

As illustrated in Table 23 and FIG. 22, the first and second auxiliary support portions S1 and S2 at positions at which these auxiliary support portions ran off the long sides 18c and 18d of the rectangular crystal piece 18 by 0.12 mm (h1=−0.12) are moved toward each other until the distances h1 from the long sides 18c and 18d of the rectangular crystal piece 18 to the respective peripheral edges S1a and S2a of the auxiliary support portions S1 and S2 respectively near the long sides 18c and 18d change to 0.3 mm (h1=0.3).

When the positions of the first and second auxiliary support portions S1 and S2 are shifted so that these auxiliary support portions move toward each other, the maximum tensile stress of the adhesive 19 and the maximum von Mises stress at the center of the crystal piece 18 become gradually smaller and then decreases to the minimum when the near peripheral edge distances h1 are respectively approximately 0.14 mm (h1=0.14). Then, the maximum tensile stress of the adhesive 19 and the maximum von Mises stress at the center of the crystal piece 18 start to increase again.

Preferable positions of the first and second auxiliary support portions S1 and S2 at which the maximum tensile stress of the adhesive 19 is equal to or smaller than 1124 (kgf/mm$^2$) and the maximum von Mises stress at the center of the crystal piece 18 is equal to or smaller than 523 (kgf/mm$^2$) are within regions in which the near peripheral edge distances h1 are respectively h1=0.001 mm to 0.26 mm. The columns in Table 3 not circumscribed in boldface show this range of values.

The near peripheral edge distance h1 is a distance measured from the long side 18c, 18d of the crystal piece 18 to the peripheral edge S1a, S2a of the first, second auxiliary support portion S1, S2 near the long side 18c, 18d. Therefore, the distance from the long side 18c, 18d of the crystal piece 18 to the peripheral edge S1b, S2b of the first, second auxiliary support portion S1, S2 distant from the long side 18c, 18d, which is the distant peripheral edge distance h2, is a value calculated by adding the diameter of the adhesive 19 of the auxiliary support portion S1, S2 expressed by (2×r), more specifically, 0.24 (=0.12×2) mm, to the near peripheral edge distance h1; h2=0.241 mm to 0.50 mm.

Therefore, a region in which the first, second auxiliary support portion S1, S2 may be present is a region from a position at which the minimal value of the near peripheral edge distance h1 is 0.001 mm to a position at which the maximum value of the distant peripheral edge distance h2 is 0.50 mm.

As illustrated in FIG. 20, the near peripheral edge distance h1 and the distant peripheral edge distance h2 are distances H measured from the long sides 18c and 18d of the crystal piece 18 respectively on the same sides as the auxiliary support portions S1 and S2 with respect to the centerline CL connecting the center points of the short sides 18a and 18.

Expressing the region in which the first, second auxiliary support portion S1, S2 may be present using the distance H, H=0.001 mm to 0.50 mm.

More preferable positions of the first and second auxiliary support portions S1 and S2 at which the maximum tensile stress of the adhesive 19 is equal to or smaller than 1124 (kgf/mm$^2$) and the maximum von Mises stress at the center of the crystal piece 18 is equal to or smaller than 523 (kgf/mm$^2$) are within regions in which the distances H from the long sides 18$c$ and 18$d$ respectively on the same sides as the auxiliary support portions S1 and S2 illustrated in FIG. 20 are H=0.001 mm to 0.50 mm.

In each of these regions, the distance H from the long side, 18$c$, 18$d$ is substantially 0%{=(0.001/1.1)×100} to 46%{=(0.50/1.1)×100}, where a distance D from the long side, 18$c$, 18$d$ of the rectangular crystal piece 18 to the centerline CL is 50%, and a width W (1.1 mm) of the crystal piece 18, which is a length of the short side 2$a$, 2$b$ of the crystal piece 18, is 100%.

Thus, positions of the first and second auxiliary support portions S1 and S2 at which the maximum tensile stress of the adhesive 19 is equal to or smaller than 1124 (kgf/mm$^2$) and the maximum von Mises stress at the center of the crystal piece 18 is equal to or smaller than 523 (kgf/mm$^2$) are more preferably within regions in which the distances H from the long sides 18$c$ and 18$d$ are respectively 0% to 46%.

In each of these regions, as shown in Table 24, a ratio of a difference between the maximum and minimum tensile stresses of the adhesive 19 to the minimum tensile stress, [{(maximum tensile stress−minimum tensile stress)/minimum tensile stress}×100], and a ratio of a difference between the maximum and minimum von Mises stresses at the center of the crystal piece 18 to the minimum von Mises stress, [{(maximum von Mises stress−minimum von Mises stress)/minimum von Mises stress}×100], are both equal to or smaller than 3%.

TABLE 24

| | equal to or smaller than | equal to or smaller than |
|---|---|---|
| ratio of difference between maximum and minimum tensile stresses to minimum tensile stress | 3% | 1.5% |
| width W of crystal piece | 1.1 | 1.1 |
| minimum value Hmin of distance H from long side | 0.001 | 0.06 |
| maximum value Hmax of distance H from long side | 0.50 | 0.46 |
| Hmin/W | 0% | 5% |
| Hmax/W | 46% | 42% |

This table 24 indicates that the first and second auxiliary support portions S1 and S2 are situated in regions in which the distances H measured from the long sides 18$c$ and 18$d$ of the crystal piece 18 respectively on the same sides as the auxiliary support portions S1 and S2 with respect to the centerline CL are in the range of the minimum value Hmin=0.001 to the maximum value Hmax=0.50. In these regions, the distances H measured from the long sides 18$c$ and 18$d$ are respectively 0% to 46%, where the width W (1.1 mm) of the crystal piece 18, which is a length of each short side 18, 18$b$ of the crystal piece 18, is 100%.

Preferable positions of the first and second auxiliary support portions S1 and S2 at which the maximum tensile stress of the adhesive 19 is equal to or smaller than 1108 (kgf/mm$^2$) and the maximum von Mises stress at the center of the crystal piece 18 is equal to or smaller than 516 (kgf/mm$^2$) are within in regions in which the near peripheral edge distances H from the long sides 18$c$ and 18$d$ are respectively in the range of h1=0.06 mm to 0.22 mm. The columns of Table 3 circumscribed in boldface show this.

Since the near peripheral edge distance h1 is in a range of values, h1=0.06 mm to 0.22 mm, the distance from the long side 18$c$, 18$d$ of the crystal piece 18 to the peripheral edge S1$b$, S2$b$ of the first, second auxiliary support portion S1, S2 distant from the long side 18$c$, 18$d$, which is the distant peripheral edge distance h2, is a valued calculated by adding 0.24 mm to the near peripheral edge distance h1; h2=0.30 mm to 0.46 mm.

Therefore, a region in which the first, second auxiliary support portion S1, S2 may be present is a region from a position at which the minimal value of the near peripheral edge distance h1 is 0.06 mm to a position at which the maximum value of the distant peripheral edge distance h2 is 0.46 mm.

Expressing these regions by the distances H from the long sides 18$c$ and 18$d$ respectively on the same sides as the auxiliary support portions S1 and S2 with respect to the centerline CL, H=0.06 mm to 0.46 mm.

More preferable positions of the first and second auxiliary support portions S1 and S2 at which the maximum tensile stress of the adhesive 19 is equal to or smaller than 1108 (kgf/mm$^2$) and the maximum von Mises stress at the center of the crystal piece 18 is equal to or smaller than 516 (kgf/mm$^2$) are within in regions in which the distances from the long sides 18$c$ and 18$d$ of the crystal piece 18, where the distances D from the long sides 18$c$ and 18$d$ to the centerline CL are 50%, are respectively 5%{=(0.06/1.1)×100} to 42%{=(0.46/1.1)×100}.

Thus, positions of the first and second auxiliary support portions S1 and S2 at which the maximum tensile stress of the adhesive 19 is equal to or smaller than 1108 (kgf/mm$^2$) and the maximum von Mises stress at the center of the crystal piece 18 is equal to or smaller than 516 (kgf/mm$^2$) are more preferably within regions in which the distances H from the long sides 18$c$ and 18$d$ are respectively 5% to 42%.

In each of these regions, as shown in Table 24, a ratio of a difference between the maximum and minimum tensile stresses of the adhesive 19 to the minimum tensile stress, and a ratio of a difference between the maximum and minimum von Mises stresses at the center of the crystal piece 18 to the minimum von Mises stress are both equal to or smaller than 1.5%.

Table 24 indicates that the first and second auxiliary support portions S1 and S2 are situated in regions in which the distances H measured from the long sides 18$c$ and 18$d$ respectively on the same sides as the auxiliary support portions S1 and S2 with respect to the centerline CL are in the range of the minimum value Hmin=0.06 to the maximum value Hmax=0.46. In these regions, the distances H measured from the long sides 18$c$ and 18$d$ are respectively 5% to 42%, where the width W (1.1 mm) of the crystal piece 18 is 100%.

[Simulation Result with Second-Size Evaluation Model]

The second-size stress simulation result is hereinafter described.

Table 25 shows the simulation result obtained with the second-size evaluation model.

TABLE 25 stress: [kgf/mm$^2$]

| | distance h1 from long side of crystal piece (near peripheral edge distance) | | | | | | | | | | | |
|---|---|---|---|---|---|---|---|---|---|---|---|---|
| | −0.15 | −0.075 | −0.0375 | 0.001 | 0.01 | 0.05 | 0.1 | 0.15 | 0.2 | 0.25 | 0.3 | 0.35 |
| maximum tensile force of adhesive | 1756 | 1561.21 | 1526.75 | 1486 | 1481 | 1459 | 1456 | 1447 | 1444 | 1449 | 1473 | 1496 |
| maximum Von Mises stress at center of crystal piece | 792 | 731.75 | 717.84 | 707 | 704 | 697 | 690 | 688 | 689 | 693 | 700 | 712 |

Similarly to Table 23, Table 25 shows the distances measured from the respective long sides 18c and 18d of the crystal piece 18 respectively on the same sides as the auxiliary support portions S1 and S2 with respect to the centerline CL to the peripheral edges S1a and S2a of the auxiliary support portions S1 and S2 respectively near the long sides 18c and 18d, and maximum tensile stress of the adhesive 19 and maximum von Mises stress at the center of the crystal piece 18 varying with the near peripheral edge distance h1. The near peripheral edge distance h1 in the shaded columns having closely spaced hatching show a preferable range of values.

Figure 23:
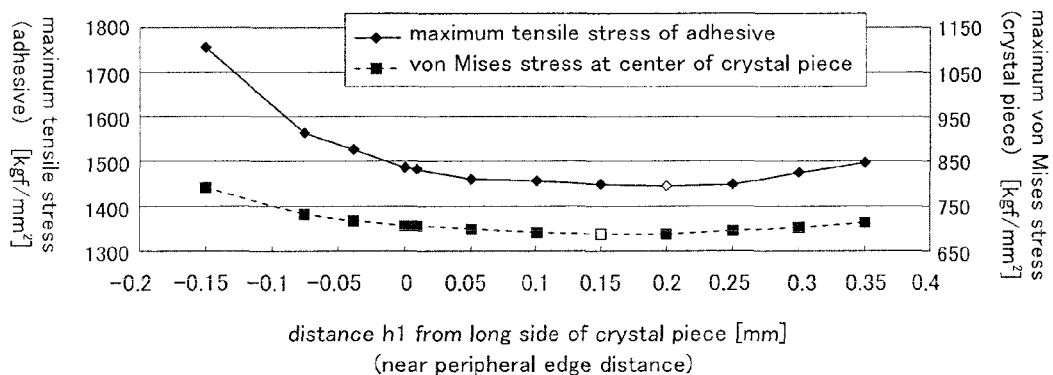
FIG. 23 shows a simulation result with a second-size evaluation model.

FIG. 23 is a graphical representation of the data of Table 25, showing the maximum tensile stress of the adhesive 19 and maximum von Mises stress at the center of the crystal piece 18 varying with the near peripheral edge distance h1. In FIG. 23, white marks respectively indicate minimum values.

As shown in Table 23 and FIG. 23, the first and second auxiliary support portions S1 and S2 at positions at which these auxiliary portions ran off by 0.15 mm the long sides 18c and 18d by 0.15 mm (h1=0.15) are moved toward each other until the distances h1 from the long sides 18c and 18d of the rectangular crystal piece 18 to the peripheral edges S1a and S2a of the first and second auxiliary support portions S1 and S2 respectively near the long sides 18c and 18d change to 0.35 mm (h1=0.35).

When the positions of the first and second auxiliary support portions S1 and S2 are shifted toward each other, the maximum tensile stress of the adhesive 19 and the maximum von Mises stress at the center of the crystal piece 18 become smaller. Then, the maximum von Mises stress at the center of the crystal piece 18 decreases to the minimum when the near peripheral edge distance h1 is approximately 0.15 mm, and the maximum tensile stress of the adhesive 19 decreases to the minimum when the near peripheral edge distance h1 is approximately 0.2 mm. Then, the maximum tensile stress of the adhesive 19 and maximum von Mises stress at the center of the crystal piece 18 start to increase again.

Preferable positions of the first and second auxiliary support portions S1 and S2 at which the maximum tensile stress of the adhesive 19 is equal to or smaller than 1487 (kgf/mm$^2$) and the maximum von Mises stress at the center of the crystal piece 18 is equal to or smaller than 708 (kgf/mm$^2$) are within regions in which the near peripheral edge distances h1 are respectively in the range of h1=0.001 mm to 0.30 mm. The hatched columns in Table 25 show this range of values.

Because the near peripheral edge distance h1 is in the range of values, h1=0.001 mm to 0.30 mm, the distance from the long side 18c, 18d of the crystal piece 18 to the peripheral edge S1b, S2b of the first, second auxiliary support portion S1, S2 distant from the long side 18c, 18d, which is the distant peripheral edge distance h2, is a valued calculated by adding the diameter of the adhesive 19 of the auxiliary support portion S1, S2, (2×r), 0.30 (=0.15×2) mm to the near peripheral edge distance h1; h2=0.301 mm to 0.60 mm.

Therefore, a region in which the first, second auxiliary support portion S1, S2 may be present is a region from a position at which the minimal value of the near peripheral edge distance h1 is 0.001 mm to a position at which the maximum value of the distant peripheral edge distance h2 is 0.60 mm.

Expressing these regions by the distances H from the long sides 18c and 18d respectively on the same sides as the auxiliary support portions S1 and S2 with respect to the centerline CL, H=0.001 mm to 0.60 mm.

More preferable positions of the first and second auxiliary support portions S1 and S2 at which the maximum tensile stress of the adhesive 19 is equal to or smaller than 1487 (kgf/mm$^2$) and the maximum von Mises stress at the center of the crystal piece 18 is equal to or smaller than 708 (kgf/mm$^2$) are within regions in which the distances from the long sides 18c and 18d, where the distances D from the long sides 18c and 18d of the crystal piece to the centerline CL are 50%, are respectively substantially 0%{=(0.001/1.4)×100} to 43%{=(0.6011.4)×100}.

Thus, positions of the first and second auxiliary support portions S1 and S2 at which the maximum tensile stress of the adhesive 19 is equal to or smaller than 1487 (kgf/mm$^2$) and the maximum von Mises stress at the center of the crystal piece 18 is equal to or smaller than 708 (kgf/mm$^2$) are more preferably within regions in which the distances H from the long sides 18c and 18d are respectively 0% to 43%.

In each of these regions, as shown in Table 26, a ratio of a difference between the maximum and minimum tensile stresses of the adhesive 19 to the minimum tensile stress, and a ratio of a difference between the maximum and minimum von Mises stresses at the center of the crystal piece 18 to the minimum von Mises stress are both equal to or smaller than 3%.

TABLE 26

| | equal to or smaller than | equal to or smaller than |
|---|---|---|
| ratio of difference between maximum and minimum tensile stresses to minimum tensile stress | 3% | 1.5% |
| width W of crystal piece | 1.4 | 1.4 |
| minimum value Hmin of distance H from long side | 0.001 | 0.05 |
| maximum value Hmax of distance H from long side | 0.60 | 0.55 |
| Hmin/W | 0% | 4% |
| Hmax/W | 43% | 39% |

Referring to Table 26, the first and second auxiliary support portions S1 and S2 are respectively within regions in which the distances H from the long sides 18c and 18d respectively on the same sides as the first and second auxiliary support portions S1 and S2 with respect to the centerline CL are in the range of the minimum value Hmin=0.001 to maximum value Hmax=0.60. In these regions, the distances H from the long sides 18c and 18d are respectively 0% to 43%, where the width W (1.4 mm) of the crystal piece 18 is 100%.

Preferable positions of the first and second auxiliary support portions S1 and S2 at which the maximum tensile stress of the adhesive 19 is equal to or smaller than 1466 (kgf/mm$^2$) and the maximum von Mises stress at the center of the crystal piece 18 is equal to or smaller than 698 (kgf/mm$^2$) are within regions in which the distances h1 from the long sides 18c and 18d are respectively h1=0.05 mm to 0.25 mm. The columns having closely spaced hatching in Table 25 indicate this range of values.

Because the near peripheral edge distance h1 is in the range of values, h1=0.05 mm to 0.25 mm, the distance from the long side 18c, 18d of the crystal piece 18 to the peripheral edge S1b, S2b of the first, second auxiliary support portion S1, S2 distant from the long side 18c, 18d, which is the distant peripheral edge distance h2, is a valued calculated by adding 0.30 mm to the near peripheral edge distance h1; h2=0.35 mm to 0.55 mm.

Therefore, a region in which the first, second auxiliary support portion S1, S2 may be present is a region from a position at which the minimal value of the near peripheral edge distance h1 is 0.05 mm to a position at which the maximum value of the distant peripheral edge distance h2 is 0.55 mm.

Expressing these regions by the distances H from the long sides 18c and 18d respectively on the same sides as the auxiliary support portions S1 and S2 with respect to the centerline CL, H=0.05 mm to 0.55 mm.

More preferable positions of the first and second auxiliary support portions S1 and S2 at which the maximum tensile stress of the adhesive 19 is equal to or smaller than 1466 (kgf/mm$^2$) and the maximum von Mises stress at the center of the crystal piece 18 is equal to or smaller than 698 (kgf/mm$^2$) are within regions in which the distances from the long sides 18c and 18d, where the distances D from the long sides 18c and 18d of the crystal piece to the centerline CL are 50%, are respectively 4%{=(0.05/1.4)×100} to 39%{=(0.55/1.4)×100}.

Thus, positions of the first and second auxiliary support portions S1 and S2 at which the maximum tensile stress of the adhesive 19 is equal to or smaller than 1466 (kgf/mm$^2$) and the maximum von Mises stress at the center of the crystal piece 18 is equal to or smaller than 698 (kgf/mm$^2$) are more preferably within regions in which the distances h1 from the long sides 18c and 18d are respectively 4% to 39%.

In each of these regions, as shown in Table 26, a ratio of a difference between the maximum and minimum tensile stresses of the adhesive 19 to the minimum tensile stress, and a ratio of a difference between the maximum and minimum von Mises stresses at the center of the crystal piece 18 to the minimum von Mises stress are both equal to or smaller than 1.5%.

Referring to Table 26, the first and second auxiliary support portions S1 and S2 are respectively within regions in which the distances H from the long sides 18c and 18d of the crystal piece 18 respectively on the same sides as the first and second auxiliary support portions S1 and S2 with respect to the centerline CL are in the range of the minimum value Hmin=0.05 mm to the maximum value Hmax=0.55 mm. In these regions, where the width W (1.4 mm) of the crystal piece 18 is 100%, the distances H from the long sides 18c and 18d are respectively 4% to 39%.

The stress simulation result described so far demonstrates that positions of the first and second auxiliary support portions S1 and S2 at which the maximum tensile stress of the adhesive 19 and the maximum von Mises stress at the center of the crystal piece 18 are well-controlled are preferably within regions in which the respective distances H are 0% to 43%, and more preferably within regions in which the respective distances H are 5% to 39%

Figure 24B:
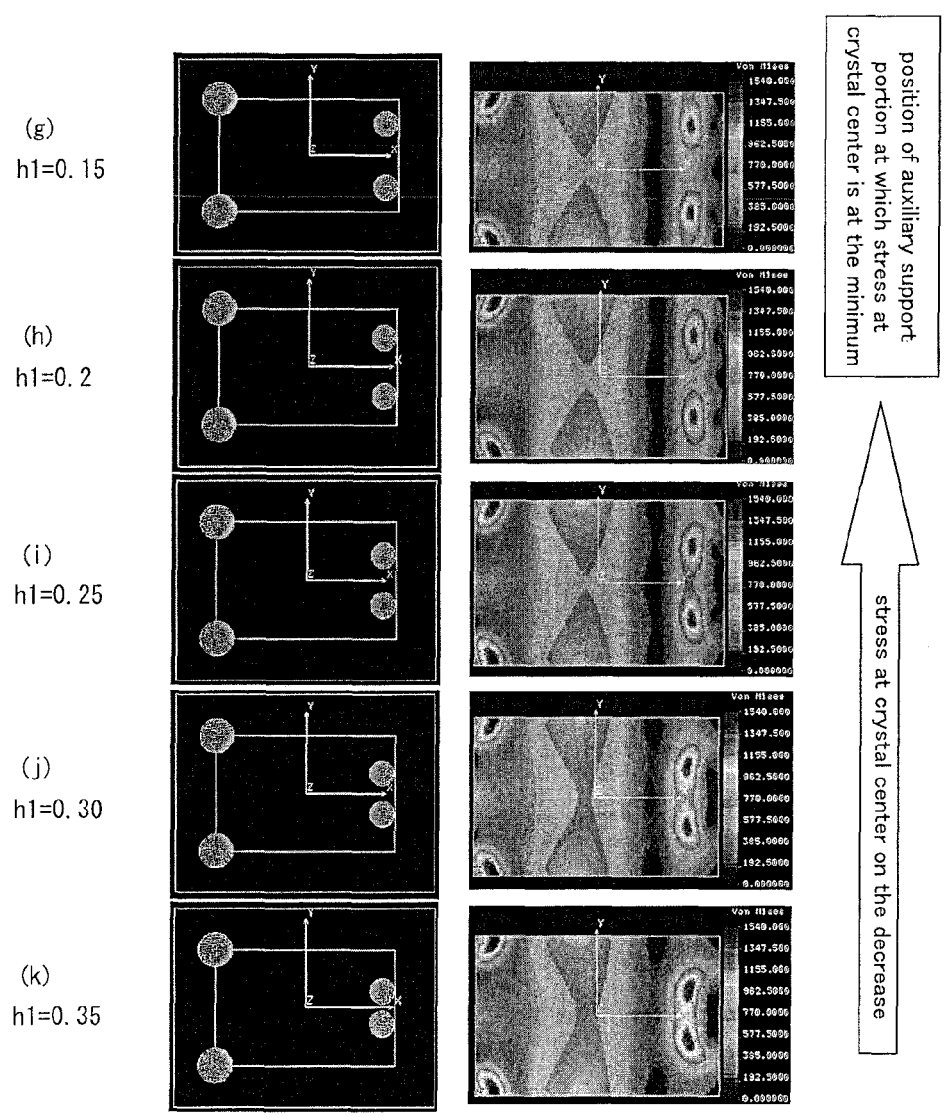
FIG. 24B are illustrations of positions of the support portions and a von Mises stress distribution of the crystal piece in the second-size evaluation model.

FIGS. 24A and 24B illustrate the positions of the respective support portions M1, M2, S1 and S2 and von Mises stress distribution of the crystal piece 18 when the first and second auxiliary support portions S1 and S2 are moving toward each other. In these drawings, the positions of the support portions are illustrated in a left-hand row, and the von Mises stress distribution of the crystal piece 18 is illustrated in a right-hand row.

Stepwise color changes from violet (0.0 kgf/mm$^2$) to red (1540 kgf/mm$^2$), as in rainbow colors, expressing increases of the von Mises stress were converted into gray images and shown in FIGS. 24A and 24B.

In FIG. 24A, (a) shows positions of the first and second auxiliary support portions S1 and S2 that respectively ran off the long sides 18c and 18d of the crystal piece 18 by ½ at which the near peripheral edge distances h1 are h1=−0.075 mm, (b) shows positions of the first and second auxiliary support portions S1 and S2 that respectively ran off the long sides 18c and 18d of the crystal piece 18 by ¼ at which the near peripheral edge distances h1 are h1=−0.0375 mm, and (c) shows positions of the first and second auxiliary support portions S1 and S2 that respectively ran off the long sides 18c and 18d of the crystal piece 18 by ⅛ at which the near peripheral edge distances h1 are h1=−0.01875 mm. The rest of FIG. 24A is, (d) positions at which the near peripheral edge distances h1 are h1=0.0 mm, (e) positions at which the near peripheral edge distances h1 are h1=0.05 mm, (f) positions at which the near peripheral edge distances h1 are h1=0.1 mm, and (g) positions at which the near peripheral edge distances h1 are h1=0.15 mm and the maximum von Mises stress at the center of the crystal piece 18 is minimized.

The illustration (g) in FIG. 24B is the same as (g) of FIG. 24A, wherein h1=0.15 mm, and the maximum von Mises stress at the center of the crystal piece 18 is minimized. The rest of FIG. 24B is (h) positions at which the near peripheral edge distances h1 are h1=0.20 mm, (i) positions at which the near peripheral edge distances h1 are h1=0.25 mm, (j) positions at which the near peripheral edge distances h1 are h1=0.3 mm, and (k) positions at which the near peripheral edge distances h1 are h1=0.35 mm and the maximum von Mises stress at the center of the crystal piece 18 is minimized.

FIG. 24A shows variations when the first and second auxiliary support portions S1 and S2 were moved toward each other from (a) to (g). FIG. 24B variations when the first and second auxiliary support portions S1 and S2 were further moved toward each other from (g) to (k).

Observing the stress at the center of the crystal piece 18 illustrated in FIG. 24A, a portion subject to a stress, approximately 700 kgf/mm$^2$, is vertically continuous. As the first and second auxiliary support portions S1 and S2 are moved toward each other as illustrated in (b)→(c)→(d)→(e), the stress-applied portion is laterally constricted, and a portion subject to a lower stress, approximately 600 kgf/mm$^2$, is expanding.

As the first and second auxiliary support portions S1 and S2 are further moved toward each other as illustrated in (f)→(g), the vertically continuous portion is vertically split.

In the illustration of (g), the von Mises stress at the center of the crystal piece 18 is minimized.

As the first and second auxiliary support portions S1 and S2 at the positions illustrated in (g) are further moved toward each other, the two vertically-split portions at the center of the crystal piece 18 expands, narrowing an interval between the two portions as illustrated in (g)→(h)→(i) of FIG. 24B.

As the first and second auxiliary support portions S1 and S2 at the positions illustrated in (g) are even further moved toward each other, the two vertically-split portions merge into each other to be continuous again as illustrated in (j)→(k), increasing the von Mises stress at the center of the crystal piece 18.

As described, the von Mises stress at the center of the crystal piece 18 becomes smaller as the first and second auxiliary support portions S1 and S2 move toward each other, and the near peripheral edge distances h1 reaches the lowest value, 0.15 mm. Then, the von Mises stress at the center of the crystal piece 18 starts to increase again.

As described thus far, the crystal resonator according to this embodiment provided with the first and second auxiliary support portions S1 and S2 respectively located in particular regions, the tensile stress of the adhesive 19 of the support portion M1, M2, S1, S2, and the von Mises stress at the center of the crystal piece 18 are well-controlled under such a high centrifugal acceleration as 2000 G. This improves the resistance to impact of the crystal resonator.

According to the embodiments, the crystal piece has a rectangular shape in plan view. The invention is, however, applicable to piezoelectric pieces having a square shape in plan view.

The adhesive may be replaced with, for example, a brazing material or a metal bump.

According to the embodiment, the adhesives of the first and second support portions were not used on the upper surface of the crystal piece which is an example of piezoelectric vibration pieces. After the crystal piece is mounted on the electrode pads coated with the adhesive of the base member, an adhesive may be further spread on the upper surface of the crystal piece to ensure more reliable electrochemical bonding.

The embodiments described so far are applied to the crystal resonator in which a crystal piece is used as a piezoelectric vibration piece. The invention is also applicable to piezoelectric resonators using piezoelectric vibration pieces made of, for example, piezoelectric materials such as lithium tantalate or lithium niobate instead of crystal.

The embodiments described so far were applied to the crystal resonator in which an AT-cut crystal piece was used as a piezoelectric vibration piece. The invention is also applicable to piezoelectric resonators using crystal pieces cut by different cutting techniques.

The base member 3 described in the embodiments has a recessed portion. The recessed portion formed in the base member 3 may be instead provided in the cover 4.

DESCRIPTION OF REFERENCE SYMBOLS

1 crystal resonator
2, 18 crystal piece (piezoelectric vibration piece)
3 base member
4 cover
7, 8 electrode pad
9, 10 driving electrode
11, 12 extraction electrode
13 conductive adhesive
16, 19 adhesive

The invention claimed is:
1. A piezoelectric device comprising:
a piezoelectric vibration piece having an outer rectangular shape in plan view and provided with driving electrodes on front and back main surfaces thereof, the piezoelectric vibration piece further including a pair of electrodes for respectively extracting the driving electrodes toward one of a first pair of opposing sides of two pairs of opposing sides forming the rectangular shape;
a base member having two electrode pads on an upper surface thereof, the electrode pads being respectively connected to the pair of electrodes; and
first and second support portions formed of a conductive joining material to electrically join the pair of electrodes respectively to the two electrode pads, the first and second support portions being provided to support the one of the first pair of opposing sides on the back surface of the piezoelectric vibration piece, wherein
an auxiliary support portion is further provided, the auxiliary support portion being formed of a joining material for joining, in a predetermined joint region, at least a position of the piezoelectric vibrating piece near another one of the first pair of opposing sides on the back surface thereof to the upper surface of the base member, the auxiliary support portion supporting the piezoelectric vibration piece at the position near the other one of the first pair of opposing sides on the back surface thereof and
a position of the auxiliary support portion relative to the another one of the first pair of opposing sides is set to a position at which a value of (H+D)/L expressed in percentage is smaller than 20%, and wherein H/L expressed in percentage is larger than 2%, where L is a distance between the first pair of opposing sides, H is a distance from the another one of the first pair of opposing sides to a peripheral edge of the auxiliary support portion nearest to the other one of the first pair of opposing sides when the auxiliary support portion is at a position farthest from the another one of the first pair of opposing sides, and D is a distance between the peripheral edge nearest to and a peripheral edge farthest from the another one of the first pair of opposing sides in a direction along the distance L.

2. The piezoelectric device as claimed in claim 1, wherein the value of (H+D)/L expressed in percentage is equal to or smaller than 19%.

3. The piezoelectric device as claimed in claim 1, wherein the value of (H+D)/L expressed in percentage is between 2% to 20%.

4. The piezoelectric device as claimed in claim 1, wherein of the two pairs of opposing sides forming the rectangular shape, the first pair of opposing sides is a pair of short sides and a second pair of opposing sides is a pair of long sides, and
the auxiliary support portion is located on a centerline that connects center points of the short sides.

5. The piezoelectric device as claimed in claim 1, wherein the auxiliary support portion is joined to the upper surface of the base member by means of the joining material at two positions on the another one of the first pair of opposing sides, so that first and second auxiliary support portions are formed.

6. The piezoelectric device as claimed in claim 5, wherein the first and second auxiliary support portions are located at positions line-symmetric to the centerline connecting the center points of the short sides.

7. The piezoelectric device as claimed in claim 5, wherein
the piezoelectric vibration piece has a pair of auxiliary electrodes for respectively extracting the driving electrodes toward the another one of the first pair of opposing sides of the two pairs of opposing sides,
the base member has, on the upper surface thereof, two auxiliary electrode pads respectively connected to the pair of auxiliary electrodes, and
the first and second auxiliary support portions electrically join the pair of auxiliary electrodes to the two auxiliary electrode pads.

8. The piezoelectric device as claimed in claim 1, wherein
the base member has a structure in which a recessed portion for housing therein the piezoelectric vibration piece is defined by a bottom portion and a circumferential portion formed so as to surround the bottom portion,
the bottom portion has a step portion on an inner peripheral surface thereof, and
the electrode pads, the support portions, and the auxiliary support portions are formed on the step portion.

9. The piezoelectric device as claimed in claim 1, wherein the joining material is a pasty adhesive.

10. The piezoelectric device as claimed in claim 1, wherein the auxiliary support portion has an outer shape circular or elliptical in plan view.

11. The piezoelectric device as claimed in claim 9, wherein the auxiliary support portion has a thickness in the range of 10 µm to 30 µm.

12. The piezoelectric device as claimed in claim 1, wherein an integrated circuit for driving the piezoelectric vibration piece is joined to the base member and electrically connected to the piezoelectric vibration piece.

13. The piezoelectric device as claimed claim 1, wherein the piezoelectric vibration piece is a crystal piece.

14. The piezoelectric device as claimed in claim 10, wherein the auxiliary support portion has a thickness in the range of 10 µm to 30 µm.

15. The piezoelectric device according to claim 1, wherein $(H+2*r)/L$ is smaller than 20%, and wherein r is a radius of the auxiliary support portion.

16. The piezoelectric device according to claim 1, wherein the sole electrical connection between the pair of electrodes and the electrode pads are the first and second support portions.

17. The piezoelectric device according to claim 16, wherein the first and second support portions comprise conductive adhesive.

* * * * *